(12) United States Patent
Ogihara et al.

(10) Patent No.: US 6,407,410 B1
(45) Date of Patent: Jun. 18, 2002

(54) SEMICONDUCTOR OPTICAL DEVICE

(75) Inventors: Mitsuhiko Ogihara; Yukio Nakamura; Hiroshi Hamano; Masumi Taninaka, all of Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 0 days.

(21) Appl. No.: 09/291,069

(22) Filed: Apr. 14, 1999

(30) Foreign Application Priority Data

Jun. 26, 1998 (JP) .......................................... 10-179956

(51) Int. Cl.⁷ ............................................... H01L 33/00
(52) U.S. Cl. ........................................... 257/95; 257/94
(58) Field of Search ............................. 257/94, 95, 99

(56) References Cited

U.S. PATENT DOCUMENTS 4,942,439 A     7/1990   Schairer
5,291,037 A  *  3/1994   Tanaka et al. ................. 257/79

FOREIGN PATENT DOCUMENTS

JP              64-35970        2/1999

* cited by examiner

*Primary Examiner*—Douglas A. Wille
(74) *Attorney, Agent, or Firm*—Venable; James R. Burdett

(57) ABSTRACT

A light emitting diode in accordance with the present invention has a p-n junction which is formed by selectively implanting an impurity from the surface of a semiconductor substrate, and also has an etched groove which is formed in the p-n junction area near the surface of the substrate. In the area where the etched groove is formed, the p-type area and the n-type area are spatially separated in the region of the substrate, therefore the movement of minority carriers does not occur. As a consequence, in the light emitting diode in accordance with the present invention, the movement of minority carriers in the p-n junction interface occurs at a deeper position of the semiconductor substrate. In a deep position of the semiconductor substrate, the recombination rate of minority carriers is high. Therefore if the recombination of minority carriers is increased in a deep position, the emission efficiency of the light emitting diode increases.

8 Claims, 33 Drawing Sheets

SEMICONDUCTOR OPTICAL DEVICE

BACKGROUND OF THE INVENTION

1. Field of the Invention

The present invention relates to a semiconductor optical device obtained by forming a p-n junction on a semiconductor substrate.

2. Description of Related Art

LED (Light Emitting Diode) is an example known as a semiconductor optical device.

In the case of the LED 3300 in FIG. 33, a multi-layered substrate, comprised of a $GaAs_{1-x}P_x$ inclined layer 3312 and a $GaAs_{1-y}P_y$ layer 3313, which are grown by epitaxy on a GaAs substrate 3311, is used as an n-type semiconductor substrate 3310. The $GaAs_{1-x}P_x$ inclined layer 3312 is formed such that the phosphorus composition ratio increases as it approaches the top face of the layer. Near the surface of the $GaAs_{1-y}P_y$ layer 3313, a p-type area 3320 is formed by, for example, selectively diffusing such a p-type impurity as zinc. The surface of the $GaAs_{1-y}P_y$ layer 3313 is covered with a interlayer insulator 3330, except for a part of the p-type area 3320. On the area where the diffusion area 3320 is exposed, a p-type electrode 3340 is formed. On the rear face of the GaAs substrate 3311, an electrode 3350 is formed.

As shown in FIG. 33, when the p-type area 3320 is formed by a diffusion method, a p-n junction interface 3321 in the longitudinal direction and a p-n junction interface 3322 in the lateral direction are formed in the semiconductor substrate 3310. The p-n junction interface 3321 in the longitudinal direction mainly contributes to emission at a deep position in the $GaAs_{1-y}P_y$ layer 3313. The p-n junction interface 3322 in the lateral direction mainly contributes to emission at a shallow position, that is, near the surface of the $GaAs_{1-y}P_y$ layer 3313.

A shallow position of the layer 3313 has a high density of crystal defects which are generated by the diffusion of the p-type impurity, therefore the recombination rate of carriers is low, which makes the emission efficiency poor. To increase the emission efficiency of the LED 3300, causing emission at a deep position of the $GaAs_{1-y}P_y$ layer 3313 is preferable.

However, in the p-n junction interface 3322, at a very shallow position of the $GaAs_{1-y}P_y$ layer, a microscopic turbulence of forms exists. This turbulence makes the electric field very high and tends to cause a concentration of carriers. Therefore, in the LED 3300, carriers tend to concentrate at a very shallow position in the layer 3313, making the emission efficiency poor.

SUMMARY OF THE INVENTION

An object of the present invention is to increase the emission efficiency of a semiconductor optical device.

To achieve this object, a semiconductor optical device in accordance with the present invention comprises: a semiconductor substrate having a first conductive type semiconductor layer; a second conductive area formed in the semiconductor layer by doping a second conductive type impurity, which is a different conductive type from the first conductive type, selectively from the surface of the semiconductor substrate; and an etched area formed at the interface between the second conductive type area and the other area near the surface of the semiconductor substrate.

By forming the etched area, the area near the surface of the semiconductor substrate is removed from the interface between the second conductive type area and the other area. This can improve the emission efficiency of the semiconductor device.

BRIEF DESCRIPTION OF THE DRAWINGS

Other objects and advantages of the present invention will be described with reference to the following accompanying drawings wherein.

DESCRIPTION OF THE PREFERRED EMBODIMENTS

Figure 1:
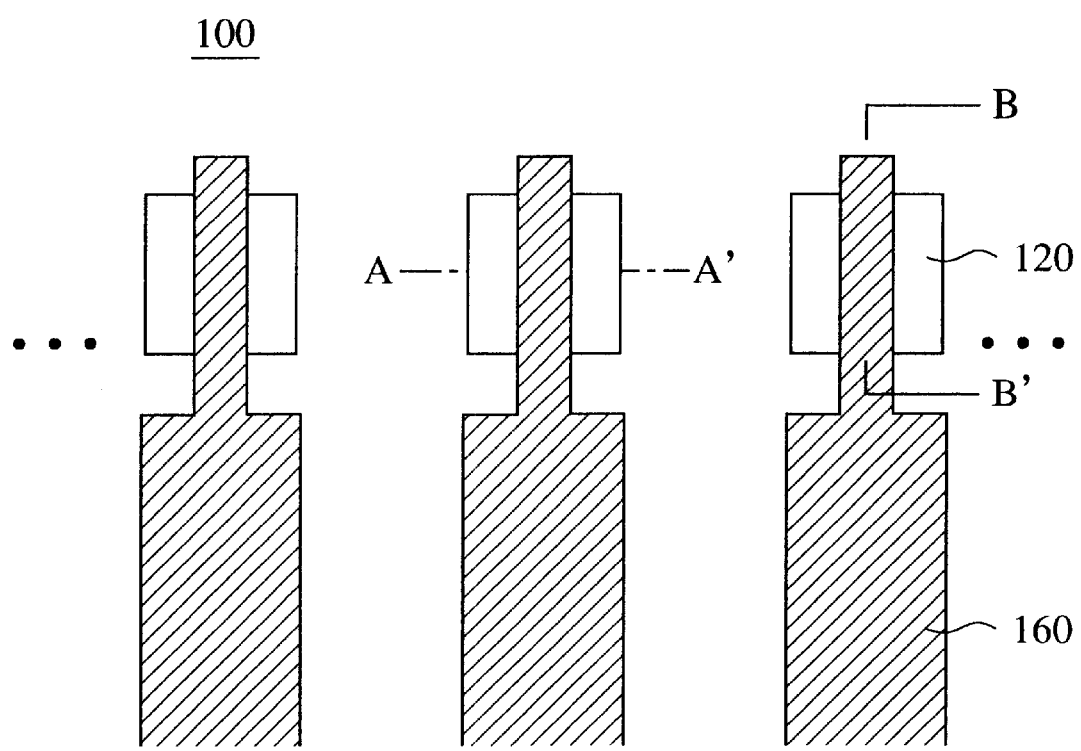
FIG. 1, FIG. 2 and FIG. 3 are drawings depicting a configuration of a semiconductor optical device in accordance with the first embodiment of the present invention.

Embodiments of the present invention will now be described with reference to the accompanying drawings. In the drawings, the size, the shape and the positional relationship of each composing element are roughly shown only to help in understanding the present invention, and the numerical conditions to be used in the descriptions below are merely examples.

First Embodiment

Figure 2:
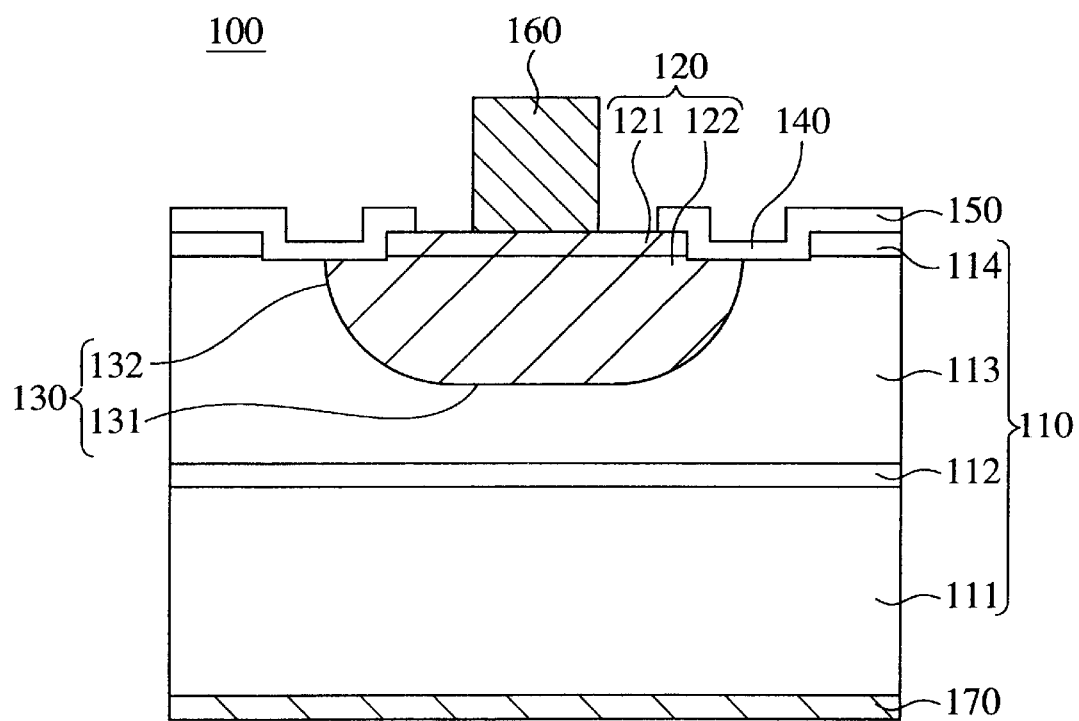
Figure 3:
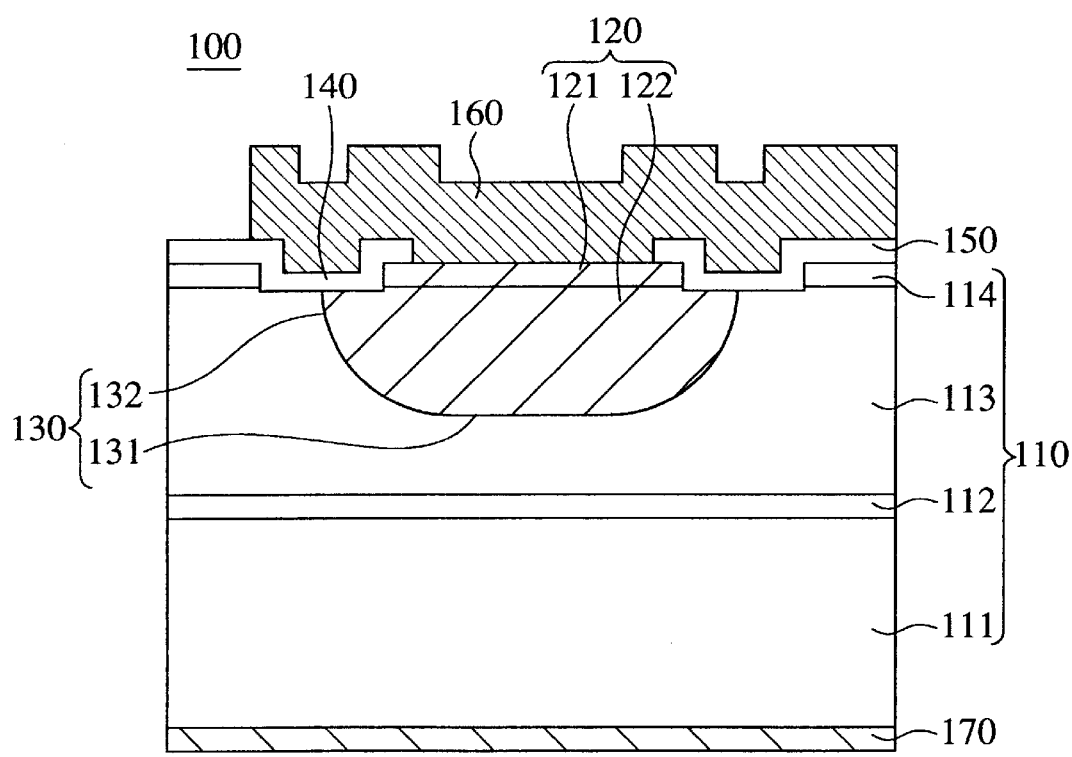

The first embodiment of the present invention is described with reference to FIG. 1 to FIG. 3. FIG. 2 is an A–A' cross-sectional view of FIG. 1, and FIG. 3 is a B–B' cross-sectional view of FIG. 3. FIG. 1 to FIG. 3 show a case when a plurality of LEDs are formed in one row, but the present invention can be applied to a case when a single LED is formed.

In this embodiment, the n-type corresponds to the first conductive type of the present invention, and the p-type corresponds to the second conductive type of the present invention.

A semiconductor substrate 110 of the LED 100 has a multi-layered structure. The substrate 110 comprises an n-type GaAs buffer layer 112, an n-type $Al_xGa_{1-x}As$ layer ($0 \leq x \leq 1$) 113 and an n-type GaAs layer 114, which are sequentially grown by epitaxy on the surface of an n-type GaAs substrate 111. The GaAs layer 114 is used for ohmic contact.

A p-type diffusion area 120 is formed by selectively diffusing such a p-type impurity as zinc into the GaAs layer 114 and the $Al_xGa_{1-x}As$ layer 113. In other words, the p-type diffusion area 120 comprises an area 121 formed in the GaAs layer 114 and an area 122 formed in the $Al_xGa_{1-x}As$ layer 113. For the selective diffusion technology, a solid phase diffusion method or a vapor phase diffusion method, for example, can be used.

The interface between the p-type diffusion area 120 and the n-type layer 113 and 114 forms a p-n junction. The p-n junction function works as a diffusion front 130 when the LED 100 emits light. The diffusion front 130 comprises a longitudinal area 131 and a lateral area 132.

In this embodiment, a part of the area 132 is removed by etching. In other words, a part of the area 132 is removed by forming an etching groove 140. The etching groove 140 can reach the depth where the surface of the $Al_xGa_{1-x}As$ layer 113 would be removed. For the etching technology, dry etching can be used and wet etching can also be used. In the area where the groove 140 is formed, the p-type diffusion region 121 is spatially separated from the n-type region in the layers 113 and 114. Therefore, minority carriers are mainly injected through the pn junction formed in the layer 113 (diffusion front 130) and radiative recombination occur mainly in the layer 113 when forward voltage is applied to the LED 100.

On the surface of the semiconductor substrate 110, a interlayer insulator 150 is formed. The interlayer insulator 150 covers the surface of the n-type GaAs area 114, the surface of the groove 140, and the peripheral area of a p-type diffusion area 121. The surface of the center area of the p-type diffusion area 121 is exposed, without being covered with the insulating interlayer film 150.

On the exposed surface of the p-type diffusion area 121, an ohmic electrode 160 is formed. The electrode 160 can be formed by aluminum, for example. As FIG. 1 shows, the electrode 160 is disposed for each LED element. The p-type side electrode 160 is insulated from the n-type area of the semiconductor substrate 110 by the insulating interlayer film 150.

On the rear surface of the GaAs substrate 111, an ohmic electrode 170 is formed. The electrode 170 is formed with gold alloy, for example. As FIG. 2 and FIG. 3 show, the electrode 170 is formed on the entire rear surface of the GaAs substrate 111, for example, and each LED element shares one electrode 170.

Next, the operation principle of the LED 100 in accordance with this embodiment is described.

To emit light from the LED 100, a forward voltage is applied between the electrode 160 and the electrode 170. When the forward voltage is applied to the LED 100 (forward voltage is applied between the electrode 160 and the electrode 170), electrons are injected from the n-type layer 113 to the p-type area 120 as minority carriers, and holes are injected from the p-type area 120 to the n-type layer 113 as minority carriers.

As mentioned above, in the LED 100, no lateral diffusion front (pn junction) is formed in the GaAs layer 121 by the groove 140. Therefore the movement of electrons and the holes does not occur between the p-type diffusion layer 121 and the n-type GaAs layer 114, but only between the p-type diffusion layer 122 and the n-type $Al_xGa_{1-x}As$ layer 113. As a consequence, light is generated mainly in the $Al_xGa_{1-x}As$ layer 113. The wavelength of this light depends on the energy band gap of the $Al_xGa_{1-x}As$ layer 113. This energy band gap mainly depends on the aluminum composition ratio x of the $Al_xGa_{1-x}As$ layer 113. This means that the emission wavelength of the LED 100 can be controlled by adjusting the aluminum composition ratio x.

Light generated in the $Al_xGa_{1-x}As$ layer 113 reaches the GaAs layer 114 or the groove 140. Since the energy band gap of the GaAs layer 114 is smaller than the energy band gap of the $Al_xGa_{1-x}As$ layer 113, the GaAs layer 114 absorbs this light. The absorption ratio of light, however, can be decreased by forming the GaAs layer 114 very thin. The thickness of the GaAs layer 114 is 50 nm, for example. Light which was not absorbed in the GaAs layer 114 transits through the interlayer insulator 150 and is radiated out of the LED 100. Light that reaches from the $Al_xGa_{1-x}As$ layer 113 to the groove 140 is also radiated out of the LED 100 through the interlayer insulator 150. Light that reaches the electrode 160, on the other hand, is reflected by the electrode 160.

As mentioned above, when a p-type impurity is diffused, crystal defects are generated in the semiconductor substrate 110. As the density of the crystal defects is higher, the recombination density of carriers is lower, and therefore the emission efficiency is lower. The density of crystal defects is higher as the area of the semiconductor substrate 110 is shallower, and is lower as the area is deeper. Therefore, in order to increase the emission efficiency of the LED 100, it is preferable to generate light in an deeper area of the semiconductor substrate 110.

Figure 33:
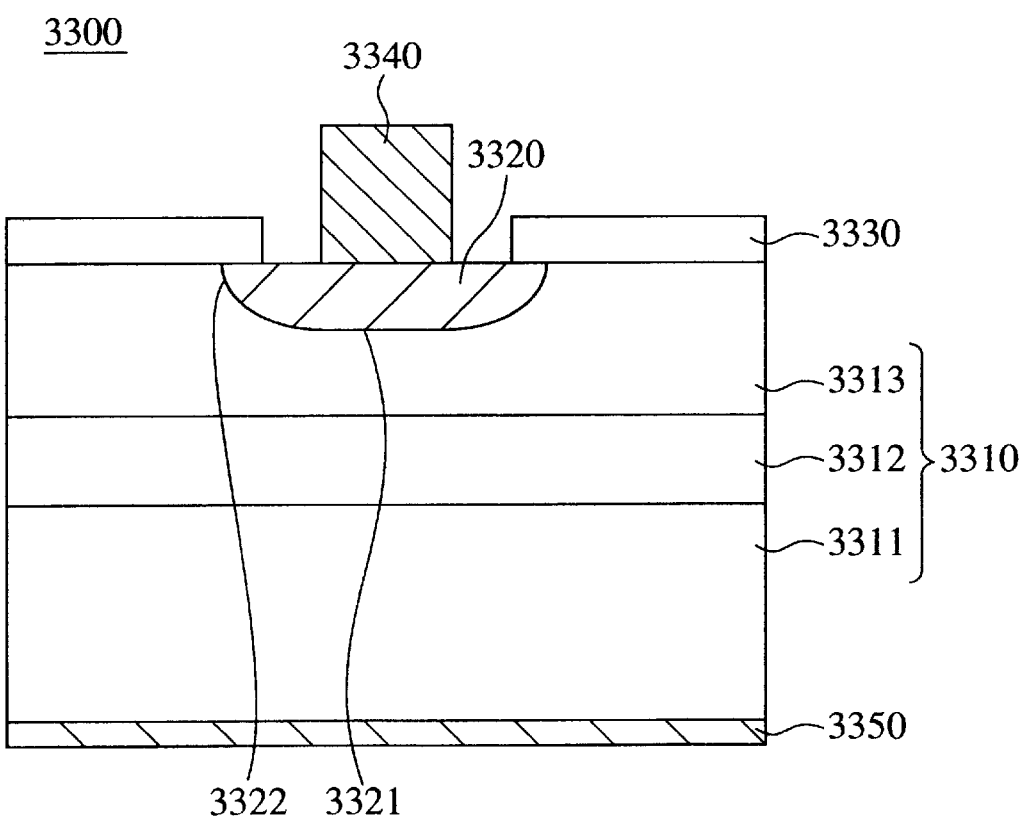
FIG. 33 is a drawing depicting a configuration of a conventional semiconductor optical device.

In the case of the LED shown in FIG. 33, light is generated at a very shallow position of the semiconductor substrate 3310. This is because a microscopic turbulence of forms exists in the diffusion front at a very shallow position, and as a result the electric field at this position becomes very high. Consequently, the injection of minority carriers concentrates to this position.

In the LED 100 in accordance with this embodiment, however, the diffusion front area at a shallow position has been removed by etching. In other words, the area where a microscopic turbulence of forms exists has been removed by etching. Therefore in the LED 100, carriers do not concentrate at a shallow position of the diffusion area, and the amount of minority carriers injected into a deep area increases. As a consequence, in the LED 100, carrier recombination increases in an area where crystal defect density is low, which results in an increase of the emission efficiency.

It is preferable to etch so as to completely remove the area where a microscope turbulence of forms exists. This etching, however, may be performed such that an area even deeper than this area is removed. By removing the deeper area of the diffusion front 130, carrier recombination can be concentrated to a very deeper area, which, further increases the emission efficiency of the LED 100.

Second Embodiment

Figure 4:
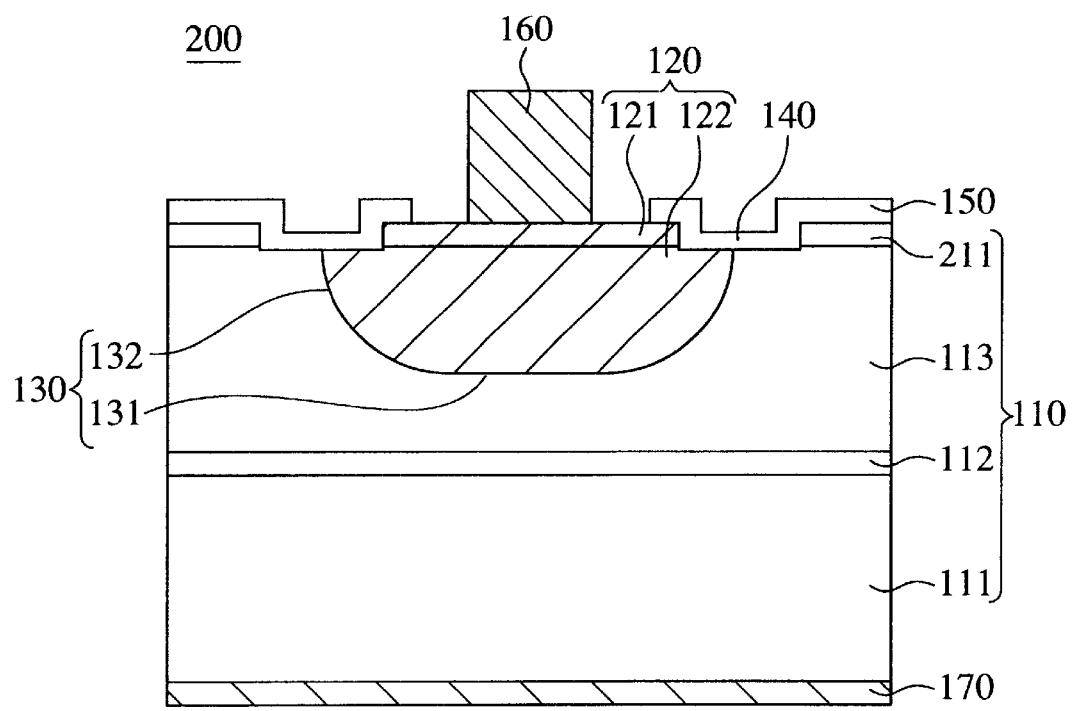
FIG. 4 is a drawing depicting a configuration of a semiconductor optical device in accordance with the second embodiment of the present invention.

Next the second embodiment of the present invention is described with reference to FIG. 4. In FIG. 4, composing elements with the same numerals as in FIG. 2 are identical with the elements in FIG. 2.

An LED 200 in accordance with this embodiment has a semi-insulating GaAs layer 211, instead of the n-type GaAs layer 114 shown in FIG. 2.

The semi-insulating GaAs layer 211 is formed with intrinsic or non-doped GaAs. When a non-doped layer is deposited by epitaxial technology, a low density n-type or p-type layer may be formed instead of an intrinsic semiconductor layer, depending on the type of semiconductor material. Such a low density layer can be used as the semi-insulating layer of the LED 200 if the resistivity is similar to that of an intrinsic semiconductor.

If the semi-insulating GaAs and the p-type GaAs are joined and a forward voltage is applied, injection of minority carriers occurs at the junction interface. In other words, a diffusion front 130 is formed even if such a junction is not a p-n junction. If such a junction has an area where a microscopic turbulence of forms exists, the electric field increases and therefore the injection density of minority carriers increases in the area. Consequently, when the top layer of the semiconductor substrate is a semi-insulator as well, the existence of such a junction interface is a cause of a decrease in the emission efficiency of the LED, just like the case when the top layer is an n-type.

The LED 200 shown in FIG. 4 has a groove 140 between the semi-insulating GaAs layer 211 and the p-type GaAs area 121. In other words, in the LED 200, the junction interface between the semi-insulating layer 211 and the p-type area 121 has been removed by etching. Therefore, the LED 200 has a very high emission efficiency.

Additionally, the groove 140 may be formed such that an area even deeper than the area where a microscope turbulence of forms exists would be removed. By removing the deeper area of the diffusion front 130, carrier recombination can be concentrated to a very deep area, which further increases the emission efficiency of the LED 200.

In the above mentioned first embodiment, the electrode 160 and the n-type area of the semiconductor substrate 110 are insulated from-each other by the interlayer insulator 150 (see FIG. 1 and FIG. 3), even if the interlayer insulator 150 is damaged. In the LED 200 of this embodiment, which uses the semi-insulating GaAs layer 211 as the top layer of the n-type area of the semiconductor substrate 110, the possibility for the electrode 160 and the semiconductor substrate 110 to be shorted is low.

Third Embodiment

Figure 5:
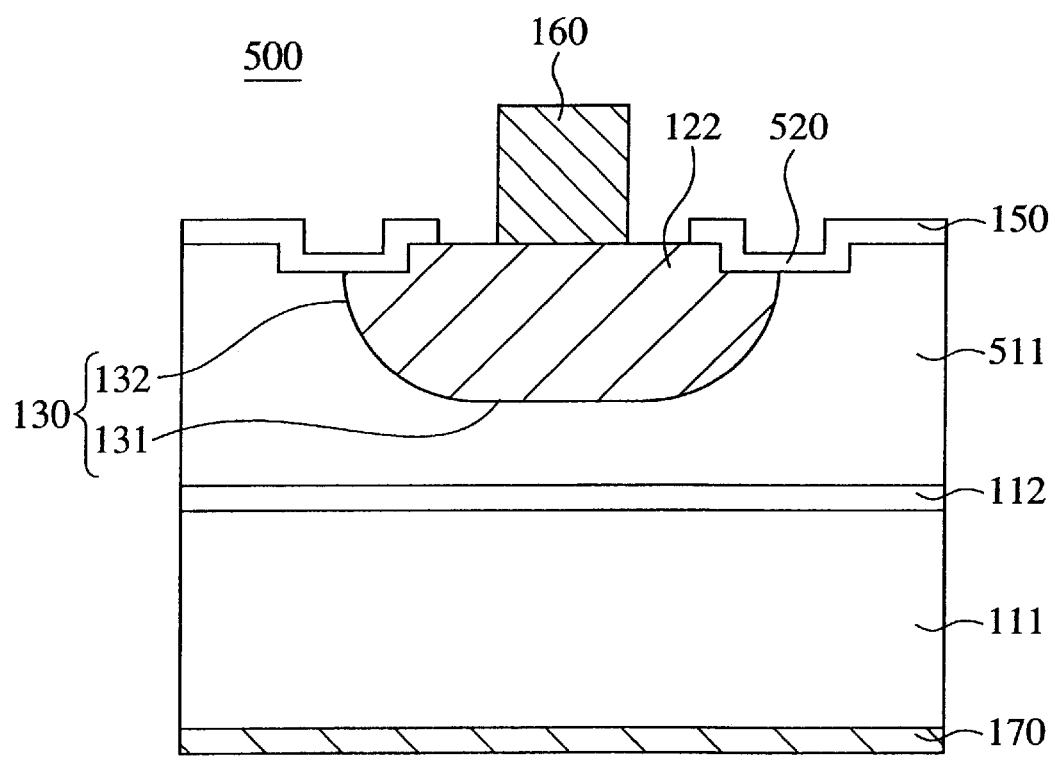
FIG. 5 and FIG. 6 are drawings depicting a configuration of a semiconductor optical device in accordance with the third embodiment of the present invention.
Figure 6:
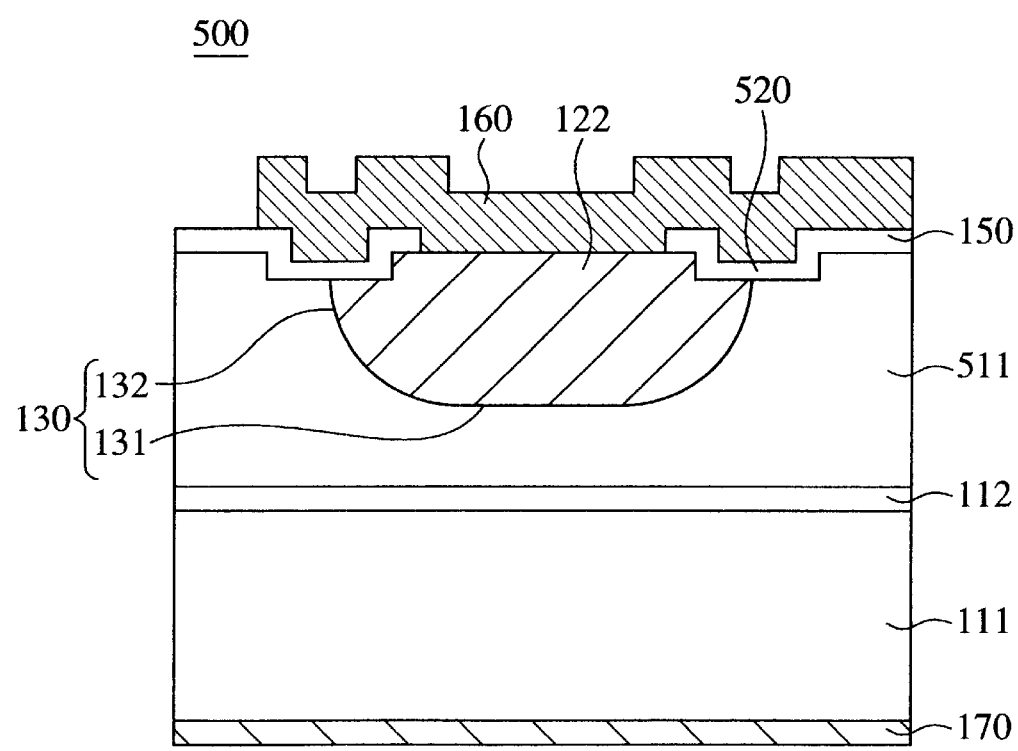

Next the third embodiment of the present invention is described with reference to FIG. 5 and FIG. 6. In FIG. 5 and FIG. 6, composing elements with the same numerals as in FIG. 1 to FIG. 3 are identical with the elements in FIG. 1 to FIG. 3.

An LED 500 in accordance with this embodiment does not have a GaAs layer formed as the top layer, which is a difference from the above mentioned first embodiment and the second embodiment. In other words, a semiconductor substrate 510 of this embodiment comprises an n-type GaAs substrate 111, an n-type GaAs buffer layer 112, and an n-type $Al_xGa_{1-x}As$ layer 511.

In this embodiment, an ohmic electrode 160 is directly formed on a diffusion layer 122 of the $Al_xGa_{1-x}As$ layer 511. Therefore, if the aluminum in the layer 511 is oxidized, good ohmic contact between the layer 511 and the electrode 160 cannot be implemented. To suppress the oxidation of aluminum, decreasing the aluminum composition ratio in the layer 511 is preferable. For example, good ohmic contact can be implemented by using x=0.15. Instead of using AlGaAs, compound semiconductor materials which contain no aluminum, such as InGaAsP, InGaP can be also used.

The p-type diffusion area 122 is formed by selectively diffusing such a p-type impurity as zinc near the surface of the layer 511. When the LED 500 is manufactured, an area where a microscopic turbulence of forms exists is formed near the surface of the layer 511.

A groove 520 is formed near the surface of the layer 511. By forming the groove 520, at least the area where a microscopic turbulence of forms exists is removed. In the area where the groove 520 is formed, the surface area of the pn-junction region 130 is removed.

When the p-type diffusion area 122 is formed, generally an insulator film 150 is used as a selective diffusion mask. When an insulator film is used as a diffusion mask, an area where a microscopic turbulence of forms exists may be formed by poor adhesion between the interlayer insulator 150 and the n-type layer 511, or by the film stress during annealing for imparts diffusion. In such an area, the electric field is higher than the other areas, and therefore the injection density of minority carriers increases. Consequently, the existence of such an area causes a decrease in the emission efficiency of the LED.

In the LED 500 shown in FIG. 5, the area where a microscopic turbulence of forms exists has been removed by forming the groove 520 between the layer 511 and the diffusion area 122. Therefore the LED 500 has a very high emission efficiency.

The groove 520 may be formed such that an area even deeper than the area where a microscopic turbulence of forms exists would be removed. By removing the deeper area of the diffusion front 130, the carrier recombination can be concentrated to a very deep area, which further increases the emission efficiency of the LED 500.

Fourth Embodiment

Figure 7:
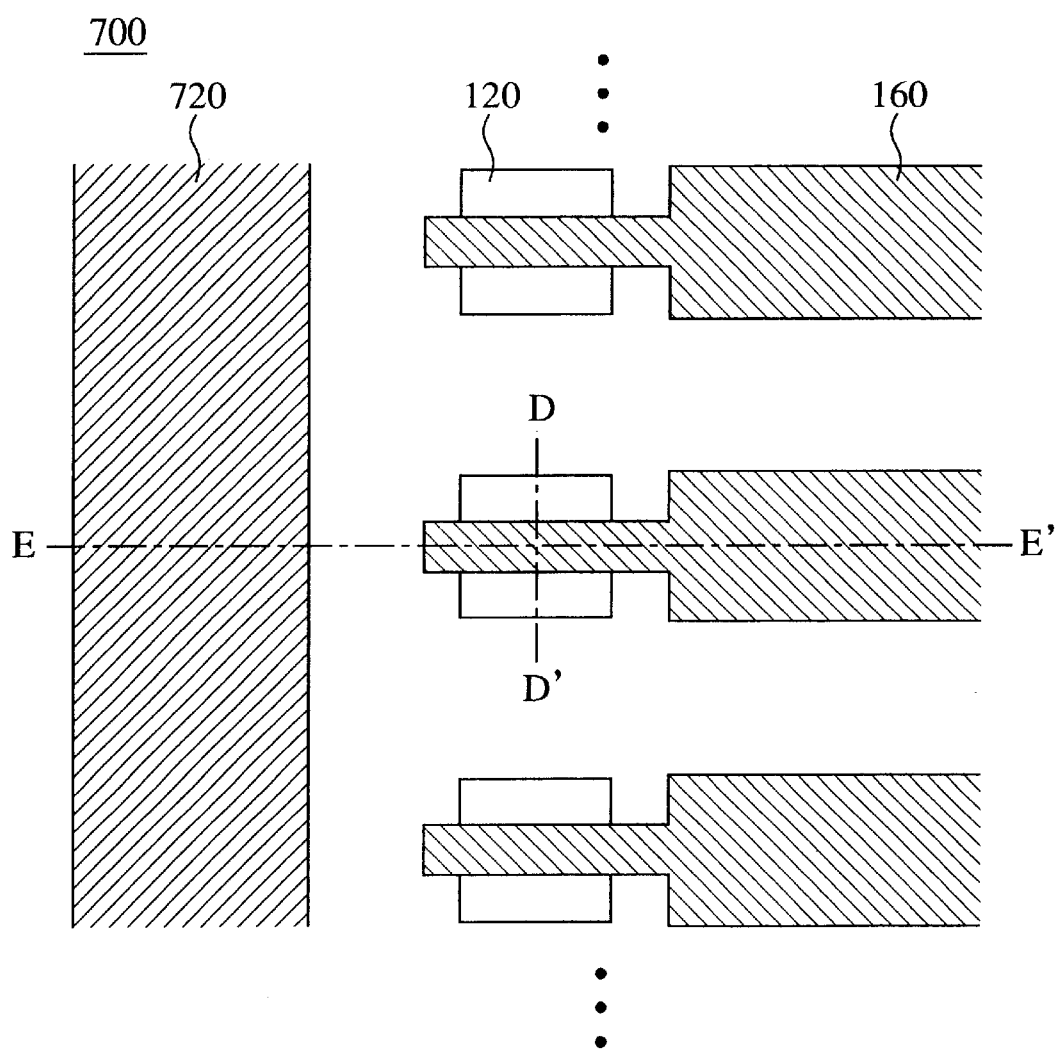
FIG. 7 to FIG. 10 are drawings depicting a configuration of a semiconductor optical device in accordance with the fourth embodiment of the present invention.
Figure 8:
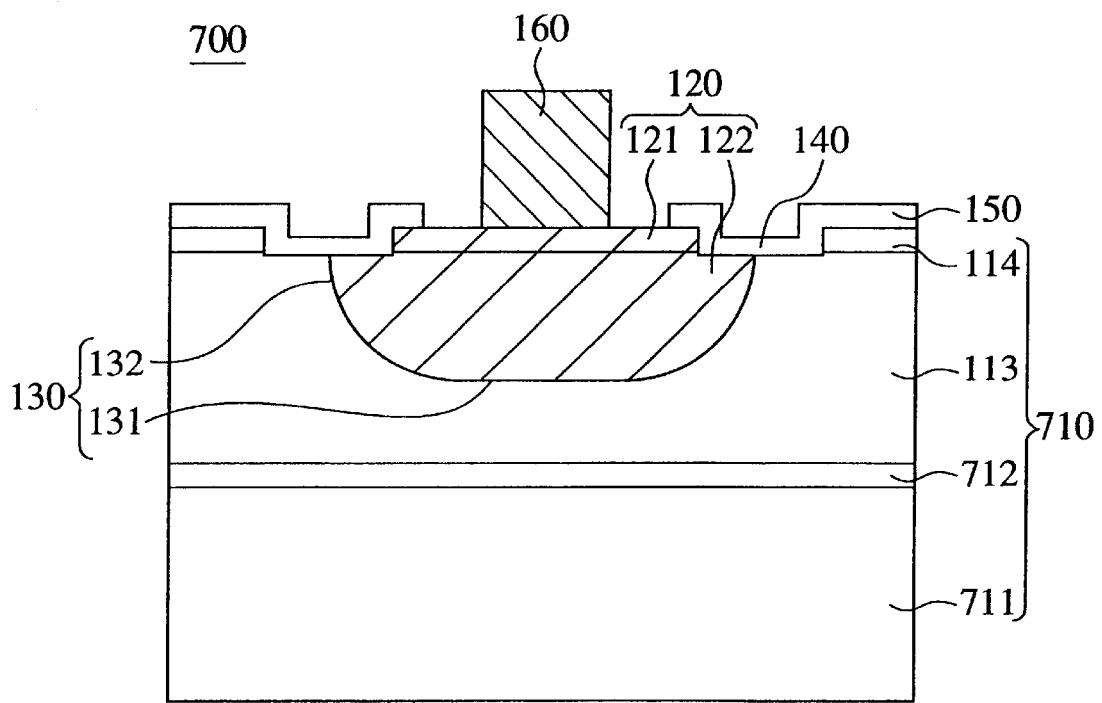
Figure 9:
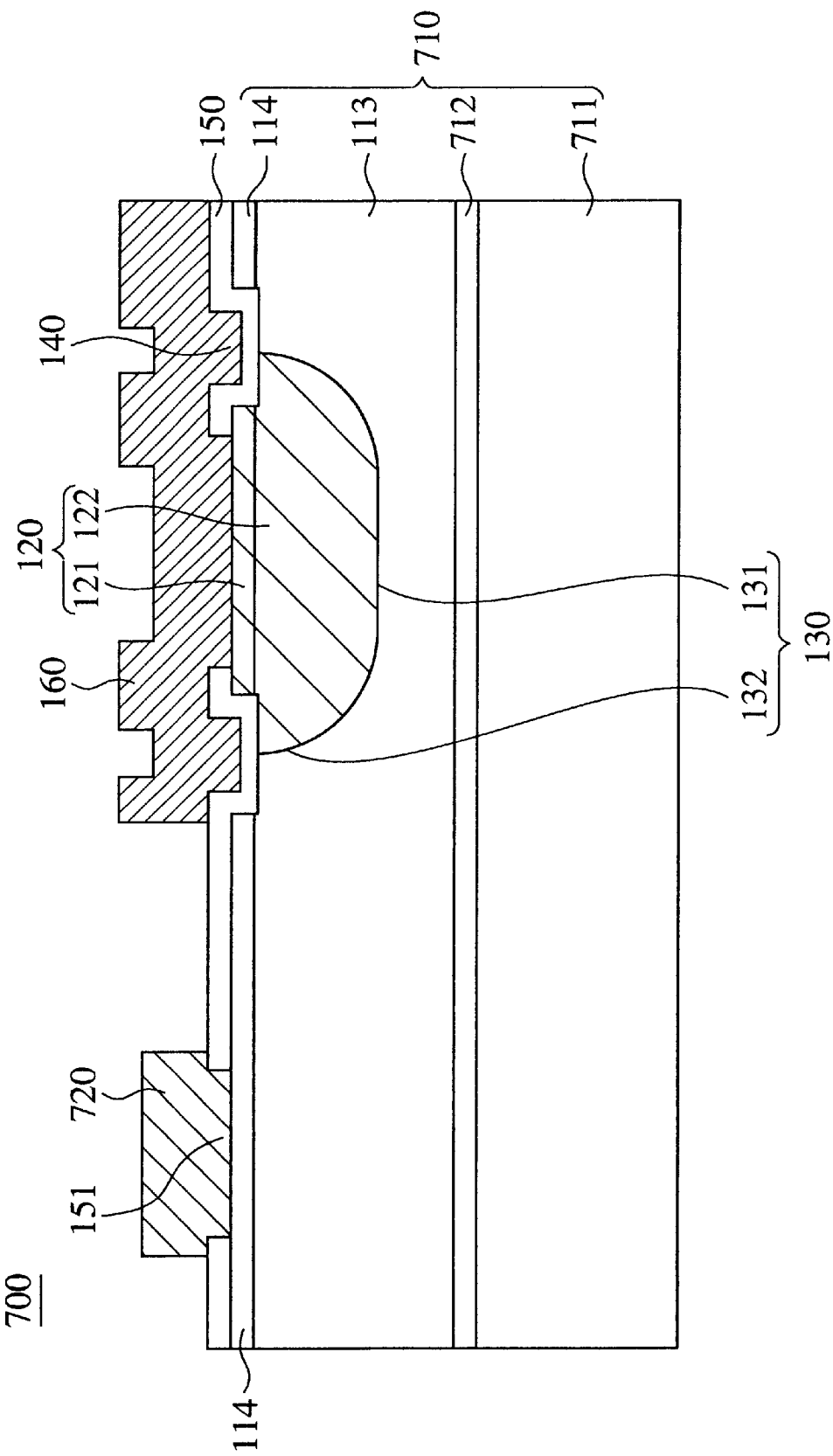

Next the fourth embodiment of the present invention is described with reference to FIG. 7 to FIG. 10. In FIG. 7 to FIG. 10, composing elements with the same numerals as in FIG. 1 to FIG. 3 are identical with the elements in FIG. 1 to FIG. 3. FIG. 7 is a plan view, FIG. 8 is a D–D' cross-sectional view of FIG. 7, and FIG. 9 is an E–E' cross-sectional view of FIG. 7.

FIG. 7 to FIG. 9 illustrate a case when a plurality of LEDs are formed in one row, but the present invention can also be applied to a case when a single LED is formed.

A semiconductor substrate 710 of the LED 700 is formed by growing a semi-insulating or p-type GaAs buffer layer 712, an n-type $Al_xGa_{1-x}As$ layer ($0 \leq x \leq 1$) 113, and an n-type GaAs layer 114 sequentially on a semi-insulating GaAs substrate 711 by epitaxy. In other words, the difference of the semiconductor substrate 710 from the above mentioned embodiments is that the GaAs substrate ill and the GaAs buffer layer 712 are semi-insulating or p-type.

On the surface of the semiconductor substrate 710, a p-type diffusion area 120, a groove 140, a interlayer insulator 150 and an electrode 160 are formed in the same manner as the first embodiment.

In this embodiment, an electrode 720 is formed on the surface of the semiconductor substrate 710, not on the rear surface of the substrate 710. The electrode 720 can be formed by gold alloy, for example. The electrode 720 is formed so as to contact with the n-type GaAs layer 114 by way of an opening 151 of the interlayer insulator 150. This junction is an ohmic contact.

In the LED 700, the diffusion front 130 at a shallow position has been removed by forming the groove 140, just like the LED 100 of the first embodiment. Since the area where a microscopic turbulence of forms exists has been removed, the LED 700 has a very high emission efficiency.

The groove 140 may be formed such that an area even deeper than the area where a microscopic turbulence of forms exists would be removed. By removing the deeper area of the diffusion front 130, carrier recombination can be concentrated to deeper area in the layer 113, which further increases the light emission efficiency (emitted light power) of the LED 700.

Figure 10:
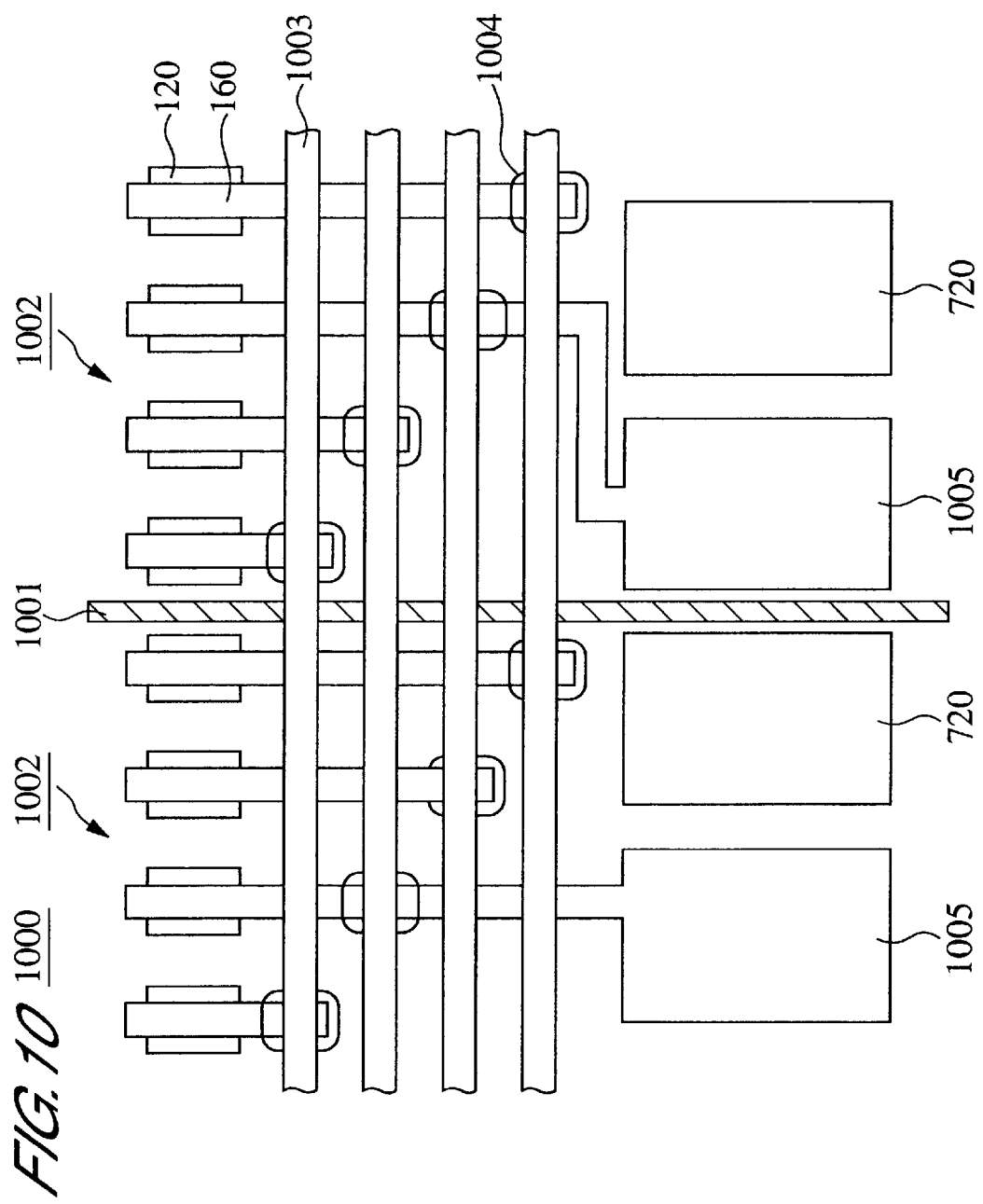

The LED 700 of this embodiment can be applied to a matrix-driven type LED array 1000, for example, as shown in FIG. 10. In FIG. 10, composing elements with the same numerals as in FIG. 7 to FIG. 9 are identical with the elements in FIG. 7 to FIG. 9.

In FIG. 10, the semiconductor substrate 710 is separated into a plurality of blocks 1002 by an element isolation area 1001. In each block, a plurality of LED elements 700 are formed.

The LED array 1000 has a plurality of common wires 1003. The electrode 160 of each LED,element 700 is connected to one of the common wires 1003 at a contact hole 1004.

The LED array 1000 has the same number of pads as the common wires 1003. A pad 1005 is connected to one of the common wires 1003.

In each block 1002, an n-type side electrode ohmic contact 720 is formed. The electrode 720 is also used as an electrode pad. An n-type side electrode contact may also be formed near a row of LEDs and is connected to an electrode pad 720.

In the LED array 1000, a desired LED element 700 can be activated by applying a forward voltage between the pad 1005 and the pad 720.

As FIG. 10 shows, the total number of pads can be decreased by commonly using the pad 1005 and the pad 720 for a plurality of LED elements.

The emission efficiency of the LED array 1000 can be increased by using the LED elements 700 shown in FIG. 7 to FIG. 9 for the LED array 1000 shown in FIG. 10.

When the LED elements 700 are applied to an LED array which is not a matrix-driven type, the GaAs substrate 711 and the GaAs buffer layer 712 may be formed with an n-type semiconductor material.

Fifth Embodiment

Figure 11:
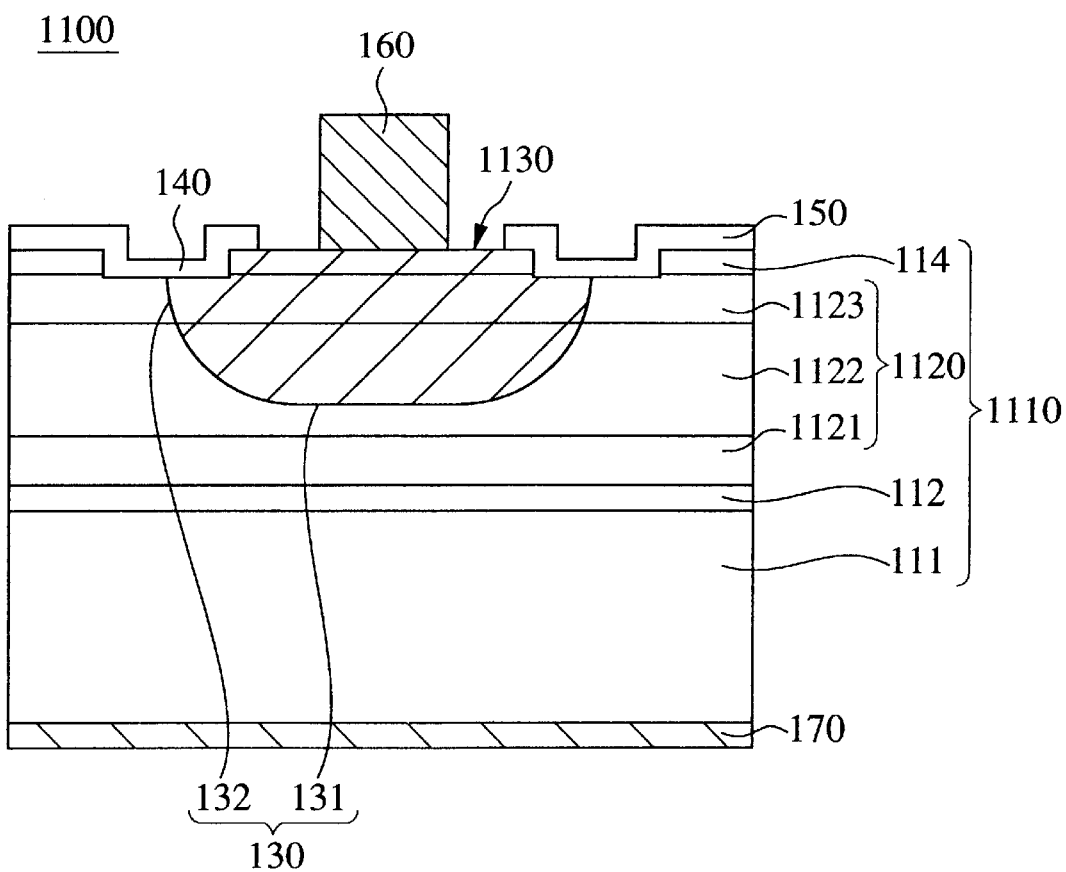
FIG. 11 to FIG. 14 are drawings depicting a configuration of a semiconductor optical device in accordance with the fifth embodiment of the present invention.
Figure 12:
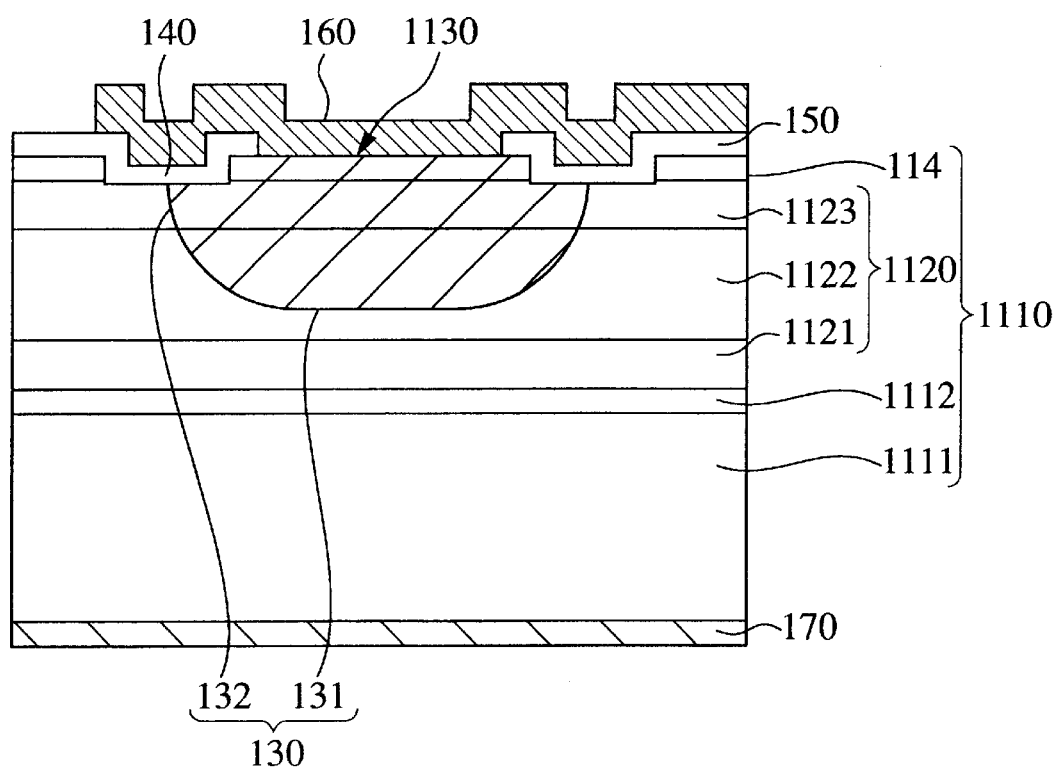
Figure 13:
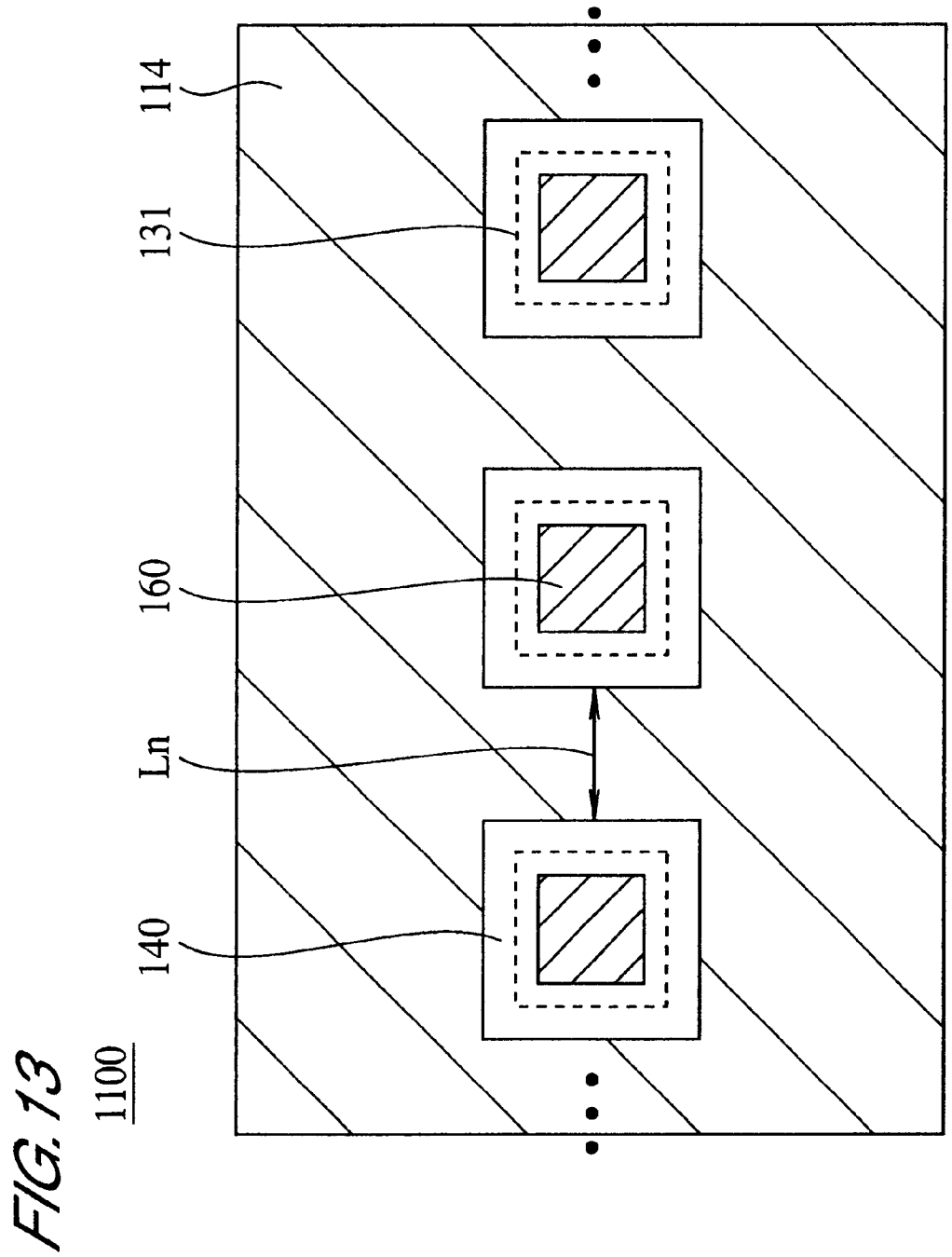

Next the fifth embodiment of the present invention is described with reference to FIG. 11 to FIG. 14. The planar structure of an LED in accordance with this embodiment is the same as FIG. 1. FIG. 11 corresponds to an A–A' cross-sectional view of FIG. 1, and FIG. 12 corresponds to a B–B' cross-sectional view of FIG. 1. In FIG. 11 and FIG. 12, composing elements with the same numerals as in FIG. 2 and FIG. 3 are identical with the elements in FIG. 2 and FIG. 3. FIG. 13 is a plan view depicting the structure of a groove of the LED in accordance with this embodiment.

In the LED 1100 of this embodiment, the structure of an AlGaAs layer 1120 disposed in a semiconductor substrate 1110 is different from the above mentioned embodiments.

The AlGaAs layer 1120 is formed by growing an $Al_xGa_{1-x}As$ layer (0<x≦1) 1121 and an $Al_yGa_{1-y}As$ layer (0<y≦1) 1122 and an $Al_zGa_{1-z}As$ layer (0<z≦1) sequentially on the surface of an n-type GaAs buffer layer 112 by epitaxy. The $Al_xGa_{1-x}As$ layer 1121 corresponds to a lower side clad layer of present invention, and the $Al_zGa_{1-z}As$ layer corresponds to an upper side clad layer of present invention.

The aluminum composition ratio x, y and z of the layers 1121, 1122 and 1123 are determined so as to satisfy the inequality (1).

$$x > y \; z > y \quad (1)$$

When x, y and z satisfy the inequality (1), the energy band gaps Egx, Egy and Egz of the layers 1121, 1122 and 1123 satisfy the inequality (2).

$$Egx > Egy \; Egz > Egy \quad (2)$$

On the surface of this AlGaAs layer 1120, an n-type GaAs layer 114 similar to the first embodiment is formed. The semiconductor substrate 1110 is completed by forming the layer 114.

On the semiconductor substrate 1110, a p-type diffusion area 1130 is formed, just like the first embodiment. The area 1130 is formed in the GaAs layer 114, the $Al_zGa_{1-z}As$ layer 1123 and the $Al_yGa_{1-y}As$ layer 1122. In other words, the area 1130 is formed such that an area 131 in the longitudinal direction of the diffusion front 130 does not reach the $Al_xGa_{1-x}As$ layer 1121.

In the GaAs layer 114, a groove 140 is formed, just like in the first embodiment. The groove 140 may reach the depth where the surface of the $Al_zGa_{1-z}As$ layer 1123 would be removed. In the area where the groove 140 has been formed, the p-type GaAs area in the p-type area 1130 and the n-type GaAs layer 114 are spatially separated.

On the surface of the semiconductor substrate 1110, a interlayer insulator 150 and an electrode 160 are formed, just like the first embodiment. On the rear face of the substrate 1110, an electrode 170 is formed, just like the first embodiment.

Next the operation of the LED 1100 is described.

In the LED 1100 in accordance with this embodiment, the energy band gap of the AlGaAs layer 1120 is small in the layer 1122, and is large in the layers 1121 and 1123, as shown in the inequality (2). Therefore, if a forward voltage is applied between the electrode 160 and the electrode 170, a movement of minority carriers concentrates in the layer 1122, and does not occur in the layers 1121 and 1123. In other words, electrons are injected from the n-type area to the p-type area in the layer 1122 as minority carriers, and holes are injected from the p-type area to the n-type area as minority carriers.

Since an electric field in the forward direction has been formed in the semiconductor substrate 1110, the minority electrons injected to the p-type area of the layer 1122 attempt to move to the layer 1123 side. However, the minority electrons cannot move into the layer 1123 because an energy barrier exists at the interface between the layer 1122 and the layer 1123. As a result, the minority electrons recombine with the holes in the p-type area of the layer 1122.

Also, since an electric field in the forward direction has been formed, the minority holes injected to the n-type area of the layer 1122 attempt to. move to the layer 1121 side. However, the minority holes cannot move into the layer 1121 because an energy barrier exists at the interface between the layer 1122 and the layer 1121. As a result, the minority holes recombine with the electrons in the n-type area of the layer 1122.

Therefore, the minority carriers, both electrons and holes, recombine in the layer 1122. As mentioned above, in a shallow position of the semiconductor substrate 1120, the density of crystal defects, which are generated during the diffusion a p-type impurity, is high, so the radiative recombination density of carriers is low, and consequently the emission efficiency is low. In the case of LED 1100 of this embodiment, carriers recombine in the layer 1122, that is, at a deep position of the semiconductor substrate 1120, therefore the emission rate is very high.

The light energy generated in the layer 1122 depends on the aluminum composition ratio y of the $Al_yGa_{1-y}As$ layer 1122. Such light energy is smaller than the energy band gap of the layer 1123. Therefore light generated in the layer 1122 transmits through the layer 1123 without being absorbed, and reaches the GaAs layer 114 or the groove 140. Since the energy band gap of the GaAs layer 114 is smaller than the energy band gap of the $Al_xGa_{1-x}As$ layer 1122, the GaAs layer 114 absorbs this light. The absorption ratio of light, however, can be decreased by forming the GaAs layer 114 very thin. The thickness of the GaAs layer is 50 nm, for example. Light which is not absorbed in the GaAs layer 114 transmits through the interlayer insulator 150 and is radiated out of the LED 1100. Light that reaches the groove 140 are also radiated out of the LED 100 through the interlayer insulator 150. Light which reaches the electrode 160, on the other hand, is reflected by the electrode 160.

The LED 1100 of this embodiment has the groove 140, just like the above mentioned embodiments, therefore a recombination of carriers does not occur in the GaAs film 114. Since the GaAs film 114 does not contribute to light emission, the emission efficiency of the LED 1100 increases.

Additionally, carriers recombine only in the layer 1122, which also increases the light emission efficiency (emitted light power).

In this embodiment, the GaAs layer 114 is disposed as the top layer of the semiconductor substrate 1120. However, a layer formed with another material may be used as the top layer only if the layer can make an ohmic connection with the electrode 160. For example, an AlGaAs layer which aluminum composition ratio is 0.2 or less can be used as the top layer. Also, a semi-insulating GaAs layer can be used as the top layer.

Figure 14:
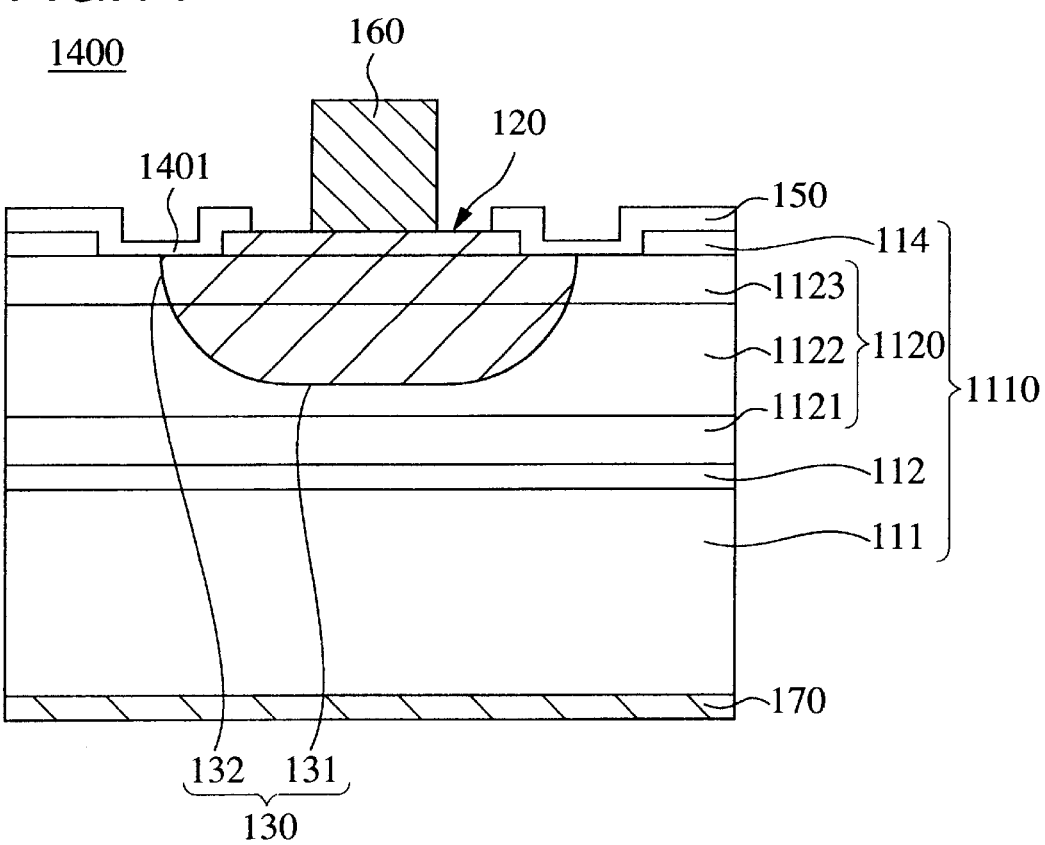

In the LED 1400 shown in FIG. 14, the groove 1401 does not reach the depth where the surface of the layer 1123 would be removed, which is a difference from the LED 1100 shown in FIG. 11 to FIG. 13. In other words, in the case of the LED 1400, only the GaAs layer 114 is removed in the process of forming the etching groove 1401. In this embodiment, carrier injection does not occur in the layer 1123, therefore, the emission efficiency is substantially the same even if the groove 140 does not reach the depth where the surface of the layer 1123 would be removed.

Sixth Embodiment

Figure 15:
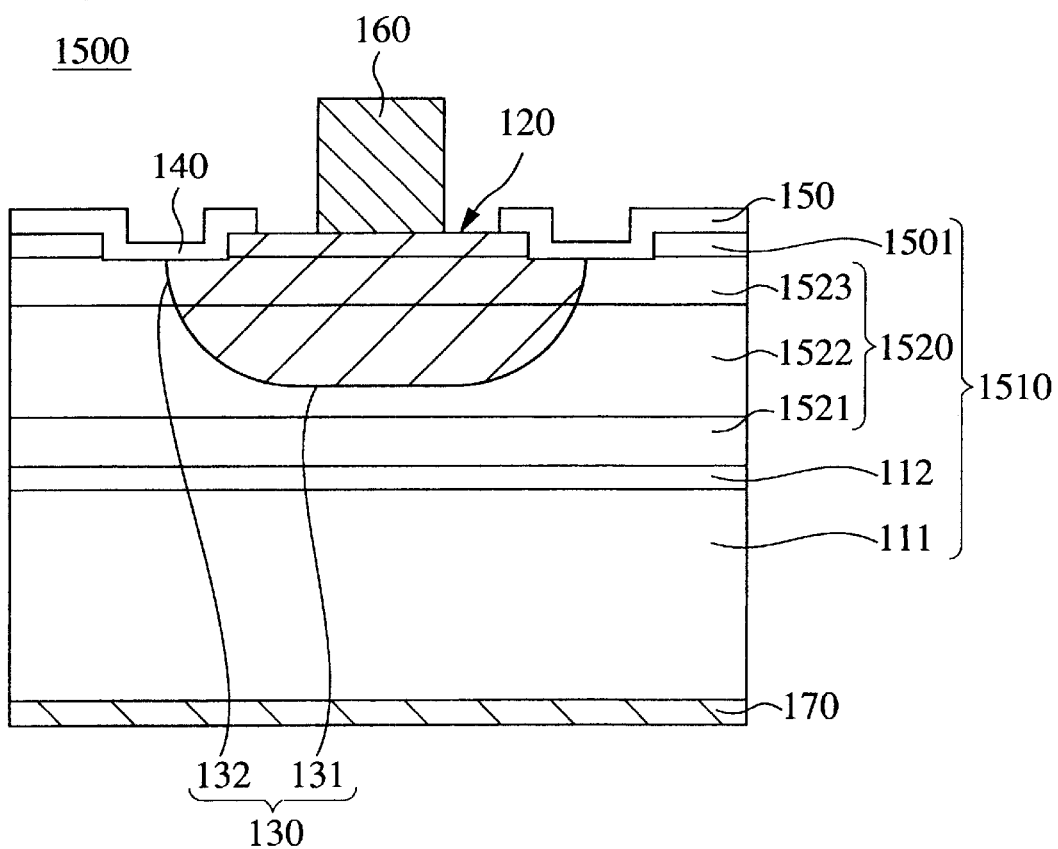
FIG. 15, FIG. 16 and FIG. 17 are drawings depicting a configuration of a semiconductor optical device in accordance with the sixth embodiment of the present invention.
Figure 16:
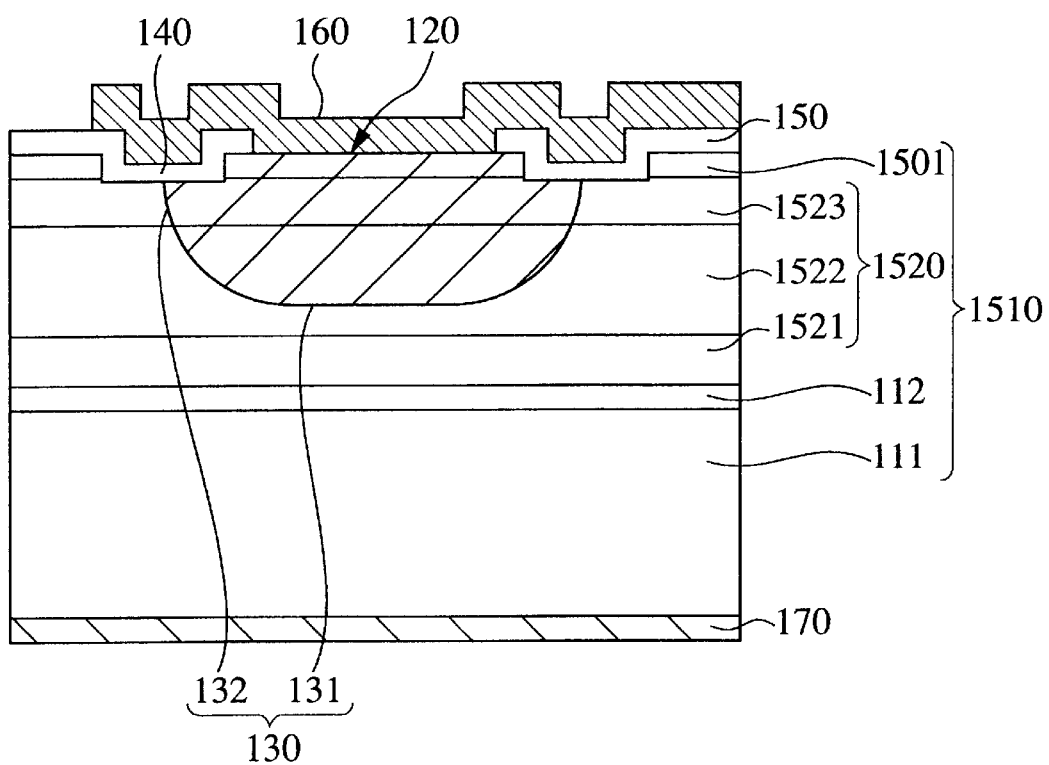

Next the sixth embodiment of the present invention is described with reference to FIG. 15 to FIG. 17.

The planar structure of an LED in accordance with this embodiment is the same as FIG. 1. FIG. 15 corresponds to an A–A' cross-sectional view of FIG. 1, and FIG. 16 corresponds to a B–B' cross-sectional view of FIG. 1. In FIG. 15 and FIG. 16, composing elements with the same numerals as in FIG. 11 and FIG. 12 are identical with the elements in FIG. 11 and FIG. 12.

The LED 1500 of this embodiment uses an AlGaAs layer 1520 in a multi-layered structure comprising an $Al_xGa_{1-x}As$ layer 1521, an $Al_yGa_{1-y}As$ layer 1522 and an $Al_zGa_{1-z}As$ layer 1523, just like the fifth embodiment. The aluminum composition ratios x, y and z satisfy the inequality (1).

The LED 1500 has a semi-insulating GaAs layer 1501, instead of the n-type GaAs layer, as a top layer of the semiconductor substrate 1510. The semi-insulating GaAs layer 1501 is formed with intrinsic or non-doped GaAs. If resistivity is similar to an intrinsic semiconductor, a low density n-type layer or p-type layer can be used as the layer 1501.

For the LED 1500 of this embodiment, minority carriers can be recombined only in the $Al_yGa_{1-y}As$ layer 1522 for the same reason as in the case of the fifth embodiment, therefore the emission efficiency is high.

Also in the LED 1500, a groove 140 has been disposed, for the same reason as the case of the second embodiment, therefore a very high emission efficiency can be implemented.

Additionally for the LED 1500, the semi-insulating GaAs layer 1501 is adopted as the top layer of the semiconductor substrate 1510, therefore an electrode 160 and the semiconductor substrate 1510 rarely short.

Figure 17:
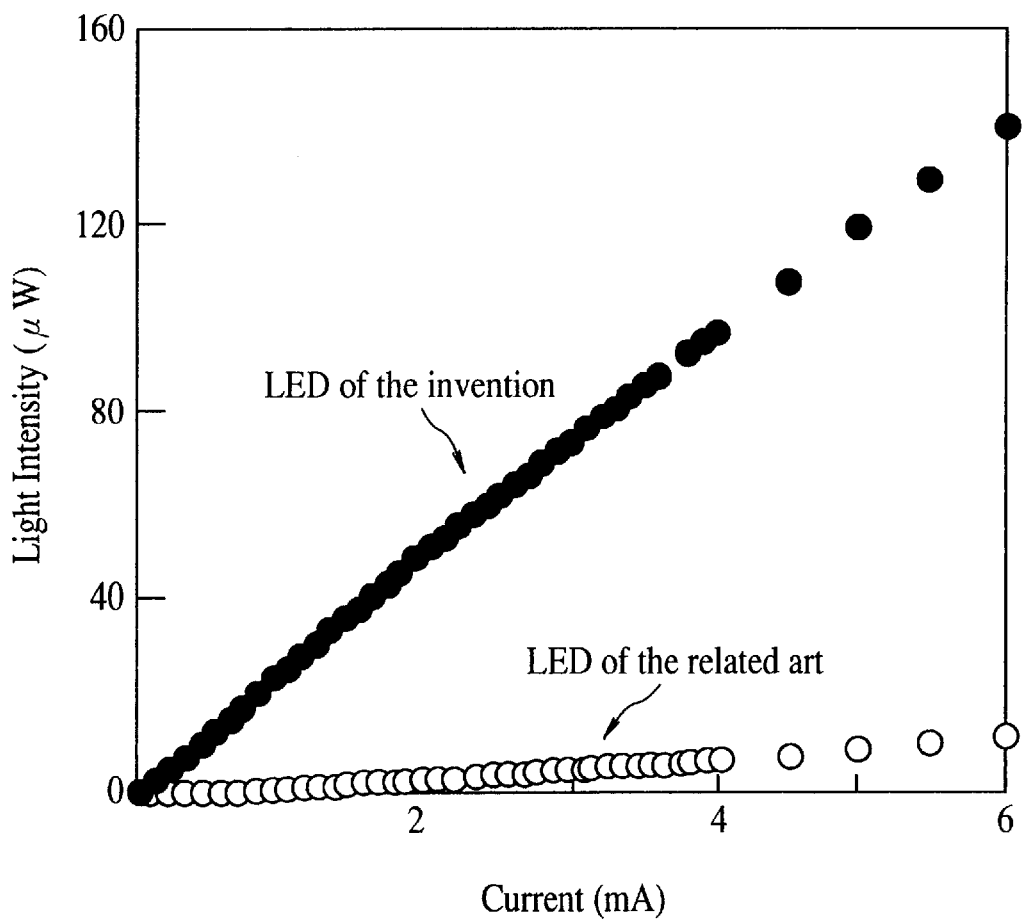

FIG. 17 shows the current—light intensity characteristics of the LED 1500 of this embodiment and the conventional LED 3300 (See FIG. 33). As FIG. 17 shows, the LED 1500 has a very high emission efficiency compared with the LED 3300. The LEDs of 1100 and 1400 have the equivalent current-light intensity characteristics to that of the LED 1500.

Seventh Embodiment

Figure 18:
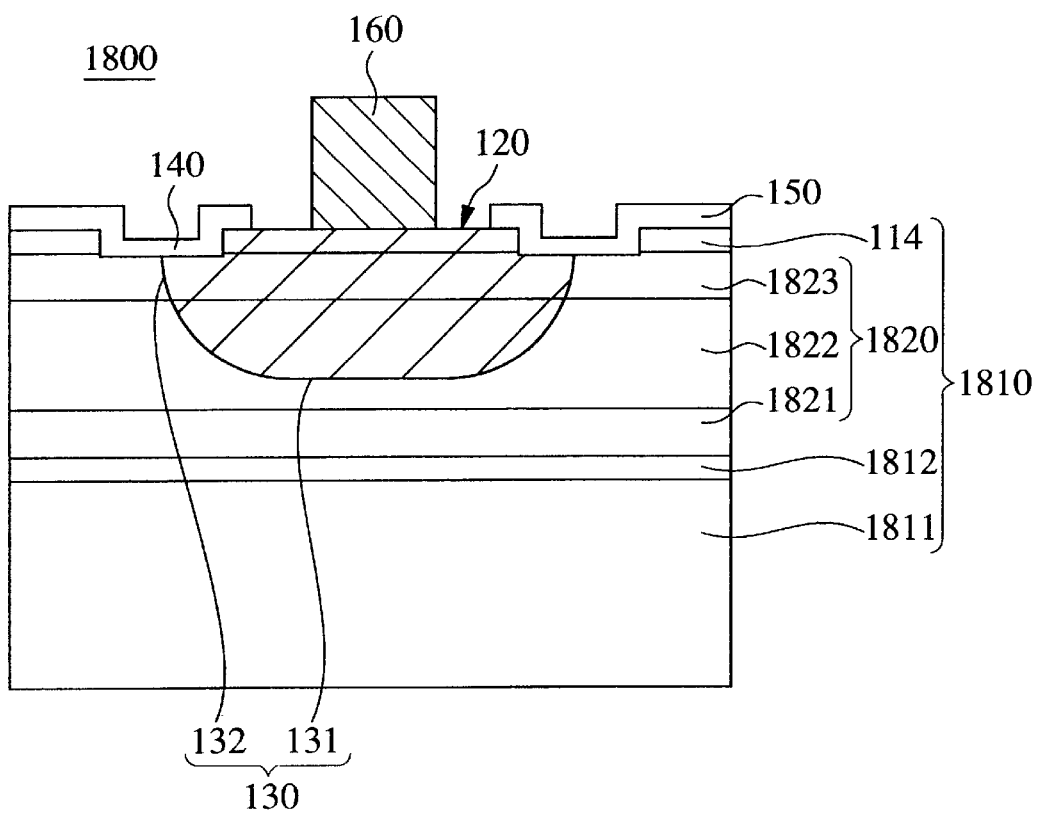
FIG. 18 and FIG. 19 are drawings depicting a configuration of a semiconductor optical device in accordance with the seventh embodiment of the present invention.
Figure 19:
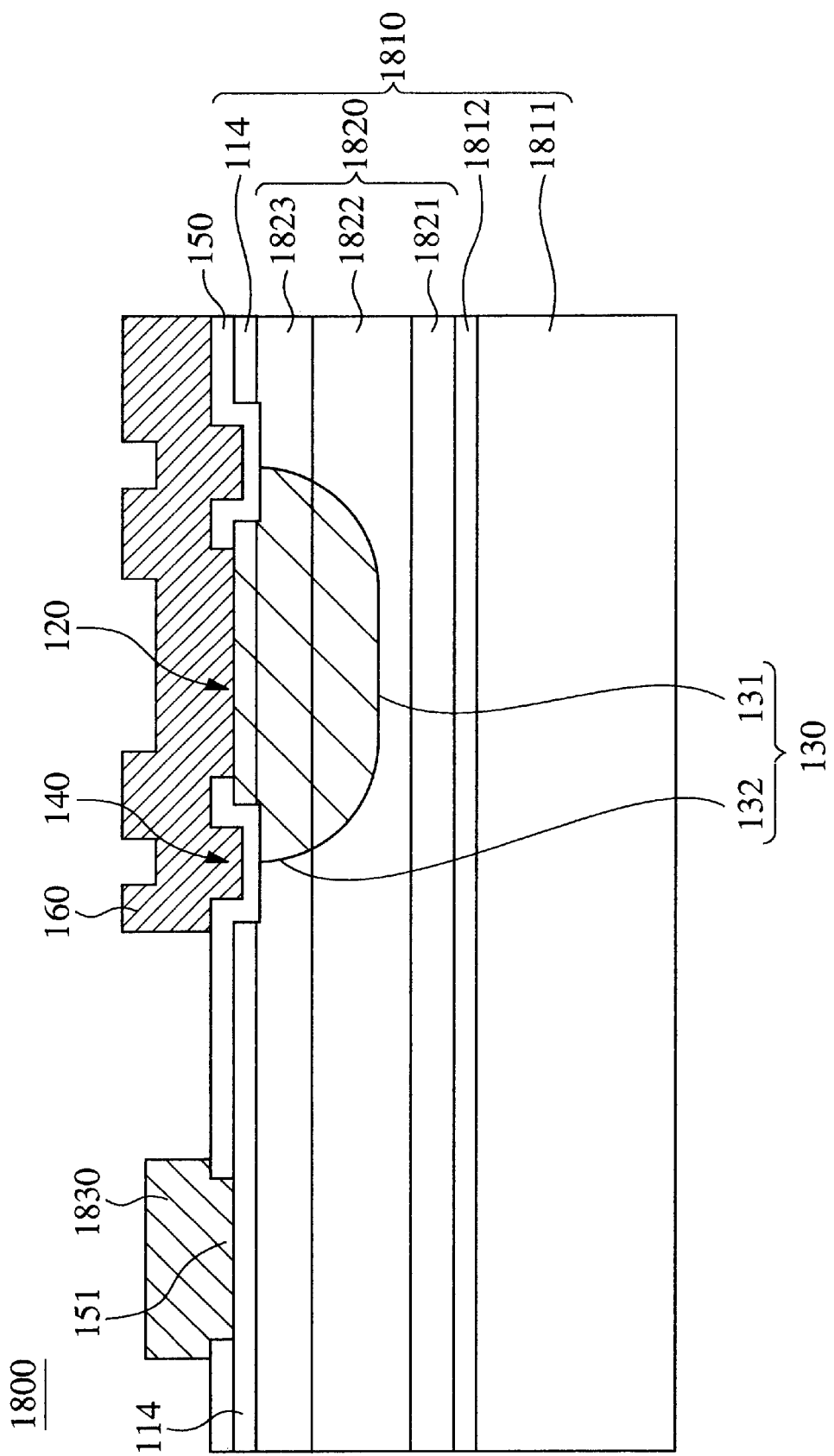

Next the seventh embodiment of the present invention is described with reference to FIG. 18 and FIG. 19.

The planar structure of an LED 1800 in accordance with the present invention is the same as FIG. 7. FIG. 18 corresponds to a D–D' cross-sectional view of FIG. 7 and FIG. 19 corresponds to an E–E' cross-sectional view of FIG. 7.

This embodiment can be applied to a case when a plurality of LEDs are formed in one row, and a case when a single LED is formed.

For a semiconductor substrate 1810 of the LED 1800, a GaAs substrate 1811 and the GaAs buffer layer 1812 are either semi-insulating or p-type semiconductor, just like the fourth embodiment.

The LED 1800 uses an AlGaAs layer 1820 in a multi-layered structure comprising an $Al_xGa_{1-x}As$ layer 1821, an $Al_yGa_{1-y}As$ layer 1822 and an $Al_zGa_{1-z}As$ layer 1823, just like the fifth embodiment. The aluminum composition ratios x, y and z satisfy the inequality (1).

An ohmic electrode 1830 in the n-type area is formed on the surface of the semiconductor substrate 1810, just like the fourth embodiment. The electrode 1830 can be formed with a gold alloy, for example. The electrode 1830 is formed so as to contact an n-type GaAs layer 114 via an opening 151 of a interlayer insulator 150.

Since the LED 1800 has a groove 140, just like the first embodiment, the emission efficiency is very high. Also minority carriers recombine in the $Al_yGa_{1-y}As$ layer 1822, just like the fifth embodiment, which increases the emission efficiency.

The LED 1800 can be applied to a matrix-driven type LED array 1000 shown in FIG. 10, just like the fourth embodiment.

When the LED device 1800 is applied to an LED array which is not a matrix-driven type, the GaAs substrate 1811 and the GaAs buffer layer 1812 may be formed with an n-type semiconductor material.

A layer formed with another material may be used as the top layer of the semiconductor substrate 1820 only if the layer can make an ohmic contact with the electrode 160 and the electrode 1830. For example, an AlGaAs layer which aluminum composition ratio is 0.2 or less can be used as the top layer. Also a semi-insulating GaAs layer can be used as the top layer.

Eighth Embodiment

Next the eighth embodiment is described with reference to FIG. 20 to FIG. 24.

Figure 20:
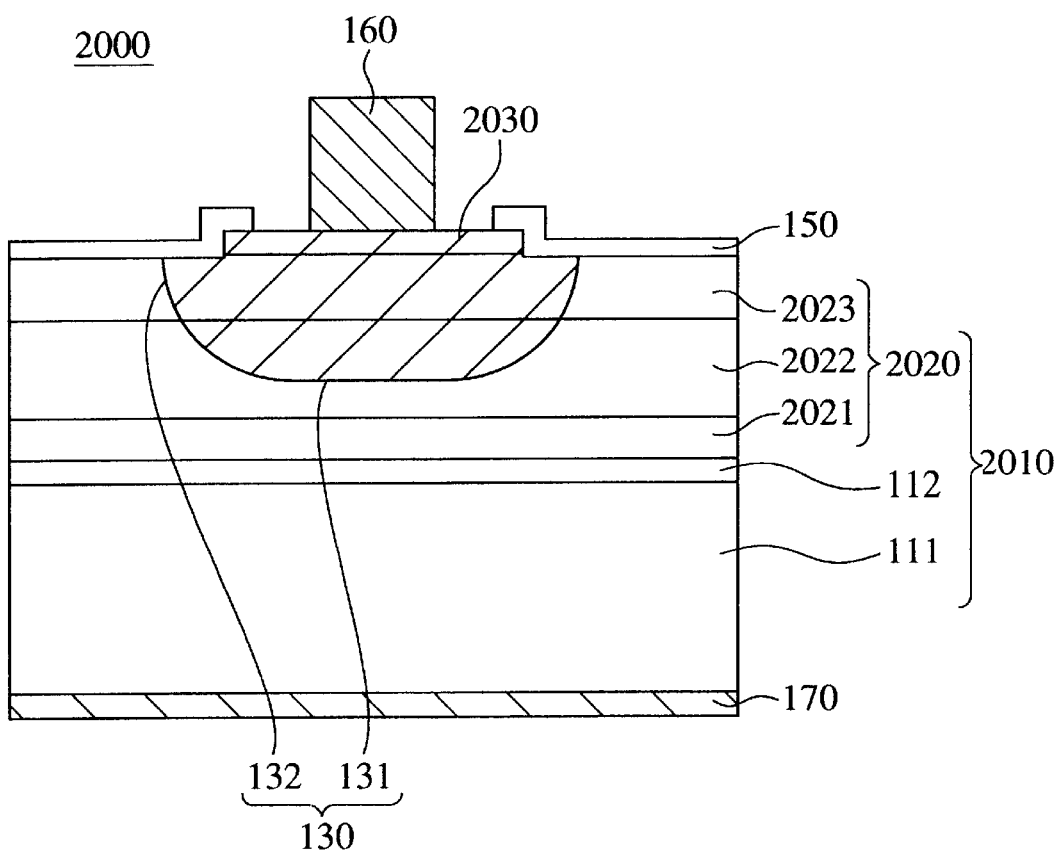
FIG. 20 to FIG. 24 are drawings depicting a configuration of a semiconductor optical device in accordance with the eighth embodiment of the present invention.

The planar structure of an LED 2000 in accordance with the present invention is the same as FIG. 1. FIG. 20 corresponds to an A–A' cross-sectional view of FIG. 1, and FIG. 21 corresponds to a B–B' cross-sectional view of FIG. 1. FIG. 22 is a conceptual plan view for describing the effects of the LED 2000.

In the LED 2000, an AlGaAs layer 2020 of a semiconductor substrate 2010 is formed by laminating an $Al_xGa_{1-x}As$ layer 2021, an $Al_yGa_{1-y}As$ layer 2022, and an $Al_zGa_{1-z}As$ layer 2023, just like the fifth embodiment. The aluminum composition ratios x, y and z satisfy the inequality (1).

In this embodiment, the groove is not formed when the area of a diffusion front 130 where a microscopic form of turbulence exists is removed by etching, which is different from the above mentioned embodiments. In this embodiment, the entire n-type area and the peripheral area of the p-type area are removed in the etching process of the GaAs layer. In other words, only the p-type GaAs area 2030 remains after the etching. In this etching process, the surface area of the $Al_zGa_{1-z}As$ layer 2030 may be removed, which is the same as the fifth embodiment.

The surface of the layer 2023 and the peripheral face of the p-type GaAs area 2023 are covered with an interlayer insulator 150, which is the same as the above mentioned embodiments.

The operation principle of the LED 2000 is almost the same as the LED 1100 of the fifth embodiment.

Light generated in the $Al_yGa_{1-y}As$ layer 2022 progresses not only in a direction vertical to the surface of the semiconductor substrate 2020, but also in diagonal directions. This means that the semiconductor substrate 2020 outputs light from areas distant from the diffusion front 130. In other words, a light radiation area 2201 also exists outside the diffusion front 130 as shown in FIG. 22.

As FIG. 22 shows, in an LED array where a plurality of LEDs are arranged in one row, the pitch P becomes shorter as the degree of integration of LEDs (the density of LEDs) increases. In addition, the space Sp between the p-type GaAs areas 2030 generally becomes smaller as the pitch P becomes shorter. In the case of an LED array used as a light source of an electrophotographic printer, for example, 1200 dpi or higher, integration is generally necessary. In an LED array where the degree of integration is 1200 dpi, the pitch P is approximately 21.2 μm, and if the width of the p-type GaAs areas 2030 is 11 μm, then the space Sp is approximately 10 μm. In addition, the space Sp between the p-type GaAs areas 2030 generally becomes smaller as the pitch P becomes shorter. In the case of an LED array used as a light source of an electrophotographic printer, for example, 1200 dpi or higher integration is generally necessary. In an LED array where the degree of integration is 1200 dpi, the pitch P is approximately 21.2 μm, and if the width of the p-type GaAs areas 2030 is 11 μm, then the space Sp is approximately 10 μm.

In the LED array, the variation of the space Sp increases as the degree of integration of the LEDs increases. Therefore, if the above mentioned fifth embodiment is applied to a highly integrated LED array, the width Ln of the n-type GaAs area between the LED elements (See FIG. 13) disperses greatly. As the variation of the width Ln increases, the dispersion of the light quantity to be absorbed by the n-type GaAs area increases. Because of this, the variation of the light emission efficiency (the emitted light power) of each LED element substantially increases as the variation of the width Ln increases.

In the case of the LED array using the LED 2000 of this embodiment, on the other hand, the variation of light emission efficiency (the emitted light power) caused by the variation of the space Sp is small because the LED 2000 does not have the n-type GaAs area, and therefore the uniformity of the light emission efficiency (the emitted light power) of the LED elements can be increased.

Also the LED 2000 in accordance with this embodiment does not have the n-type area of the GaAs contact layer, therefore the emission efficiency is even higher than the LED 1100 of the fifth embodiment.

Figure 21:
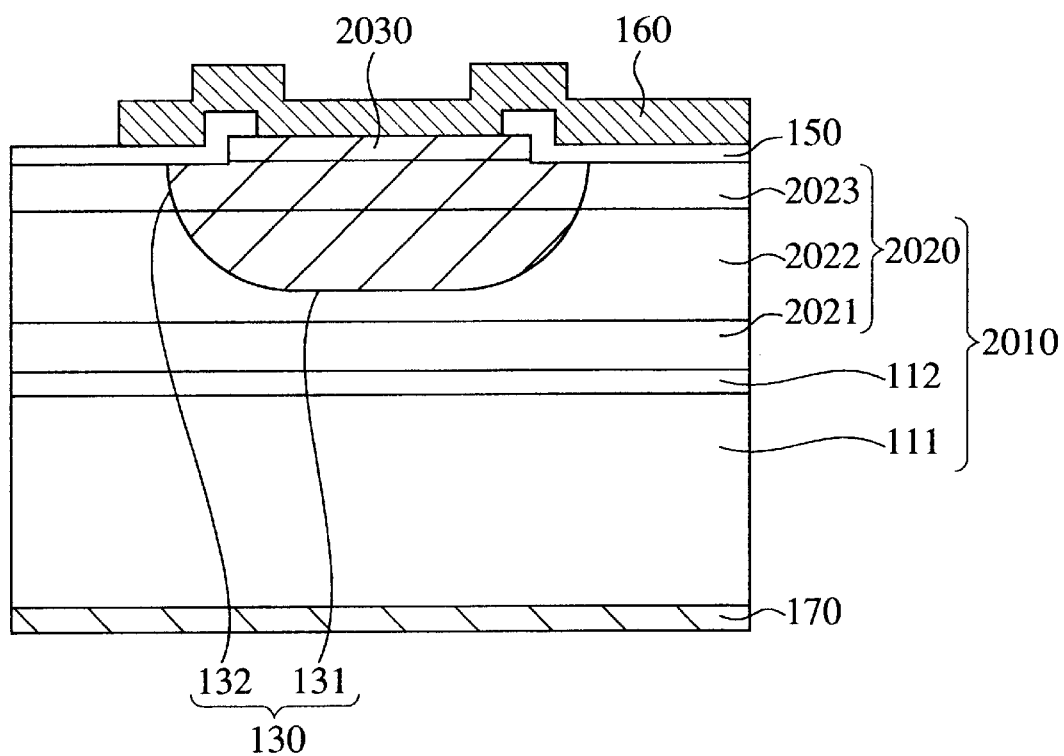
Figure 22:
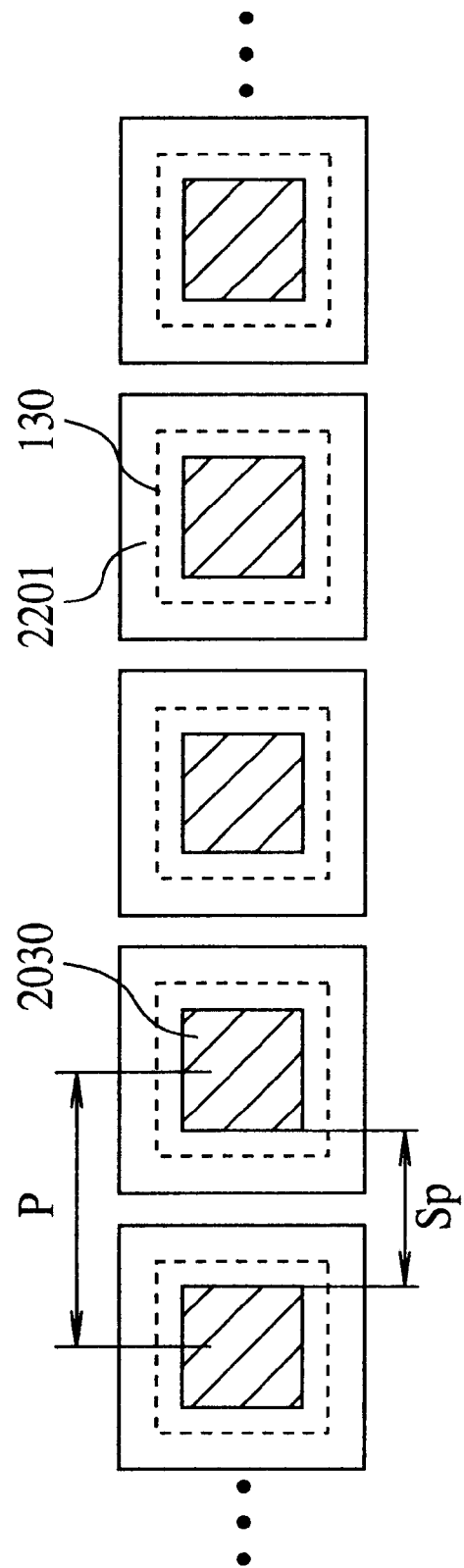

In the LED 2000 shown in FIG. 20 and FIG. 21, the AlGaAs layer 2020 of the semiconductor substrate 2010 has a multi-layered structure. However, this embodiment can be applied to an LED which uses a semiconductor substrate where the AlGaAs layer is a single layer.

Figure 23:
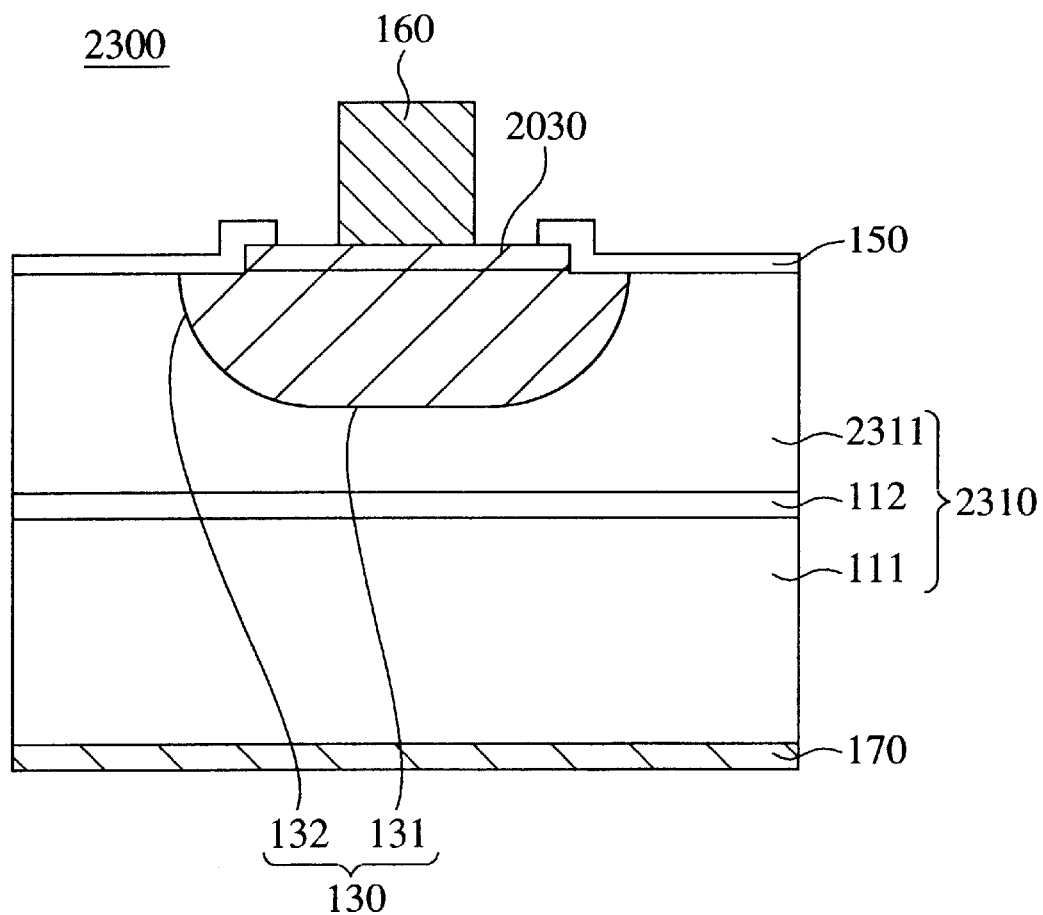
Figure 24:
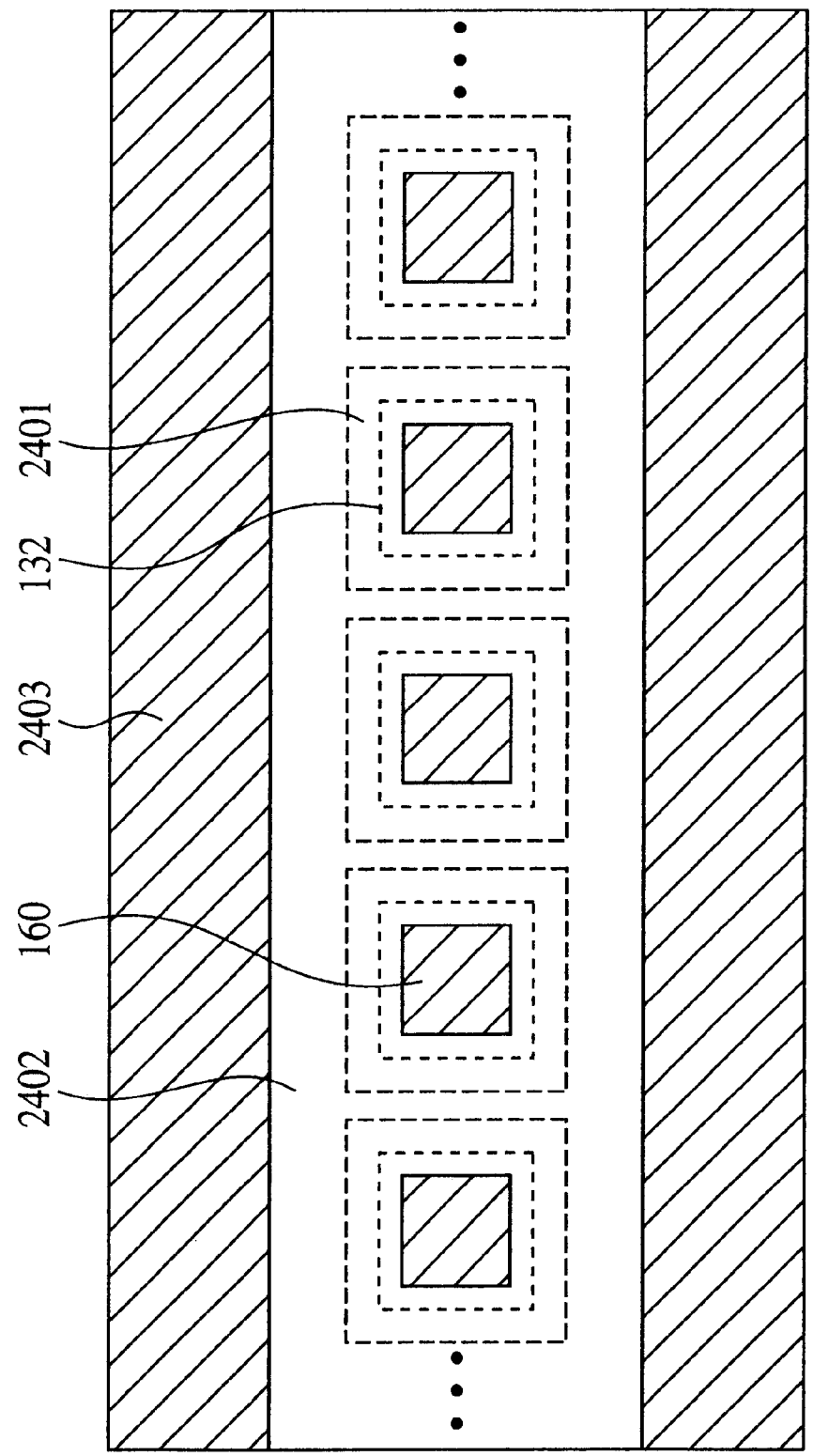

In FIG. 23, the semiconductor substrate 2310 of the LED 2300 has an AlGaAs layer 2311 comprised of a single layer. In addition, in the LED 2300, the, entire n-type GaAs area has been removed. The LED 2300 can also increase the light emission efficiency (the emitted light power) and decrease the variation of the light emission efficiency (the emitted light power).

In the LED 2300, the entire n-type area of the GaAs contact layer has been removed. At least the p-type diffusion front area in the GaAs contact layer is also removed. However, the p-type contact layer 2030 is not removed. In the example shown in FIG. 24, the area 2401, where lights are emitted out of the substrate surface, has been removed out of the GaAs contact layer by etching. In the area 2402, however, the GaAs contact layer has not been removed.

This embodiment can also be applied to the LEDs shown in the fourth embodiment and the seventh embodiment, that is, the LEDs 700 and 1800 where the electrode for n-type area 720 is formed on the top face of the semiconductor substrate. For the LEDs 700 and 1800, the light emission efficiency (the emitted light power) can be improved and the variation of the light emission efficiency (the emitted light power) can be decreased by removing the entire n-type GaAs area or the n-type GaAs area where light is emitted out of the substrate surface. The n-type area under the n-type side electrode 720, however, does not have to be removed.

This embodiment can also be applied to the LEDs shown in the second embodiment and the sixth embodiment, that is, the LEDs 200 and 1500, where the semi-insulating GaAs layer 211 and 1501, not the n type GaAs layer 114, are formed as the top layers of the semiconductor substrates. For the LEDs 200 and 1500, the light emission efficiency (the emitted light power) can be improved and the variation of the light emission efficiency (the emitted light power) can be decreased by removing the entire semi-insulating GaAs area or the semi-insulating GaAs area where light is emitted out of the substrate surface.

This embodiment can also be applied to an LED where an AlGaAs layer, not the n-type GaAs layer 114, where the aluminum composition ratio is 0.2 or less, is formed as the top layer of the semiconductor substrate.

This embodiment can also be applied to the above mentioned fifth to eighth embodiments where the clad layer 1121 under the emission layer or the clad layer 1123 on the emission layer is omitted.

In the above mentioned embodiments, the case when a p-type impurity is selectively diffused in the n-type layer of the semiconductor substrate was described as an example, but the present invention can be applied to an LED fabricated by selectively diffusing an n-type impurity in the p-type layer of the semiconductor substrate.

In the above mentioned embodiments, compound semiconductors which do not contain aluminum, such as InGaAsP, InGaP, GaAsP, and so on, instead of using AlGaAs.

Ninth Embodiment

Next the ninth embodiment is described with reference to FIG. 25 to FIG. 28.

Figure 25:
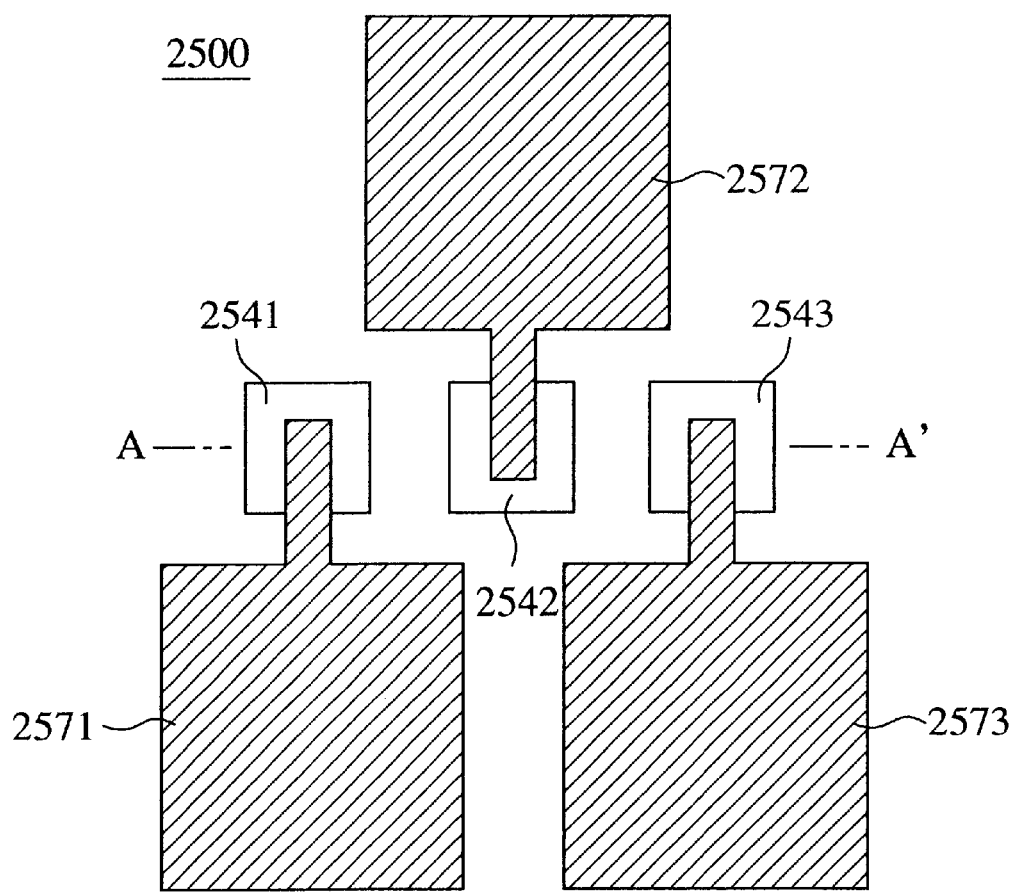
FIG. 25 to FIG. 28 are drawings depicting a configuration of a semiconductor optical device in accordance with the ninth embodiment of the present invention.
Figure 26:
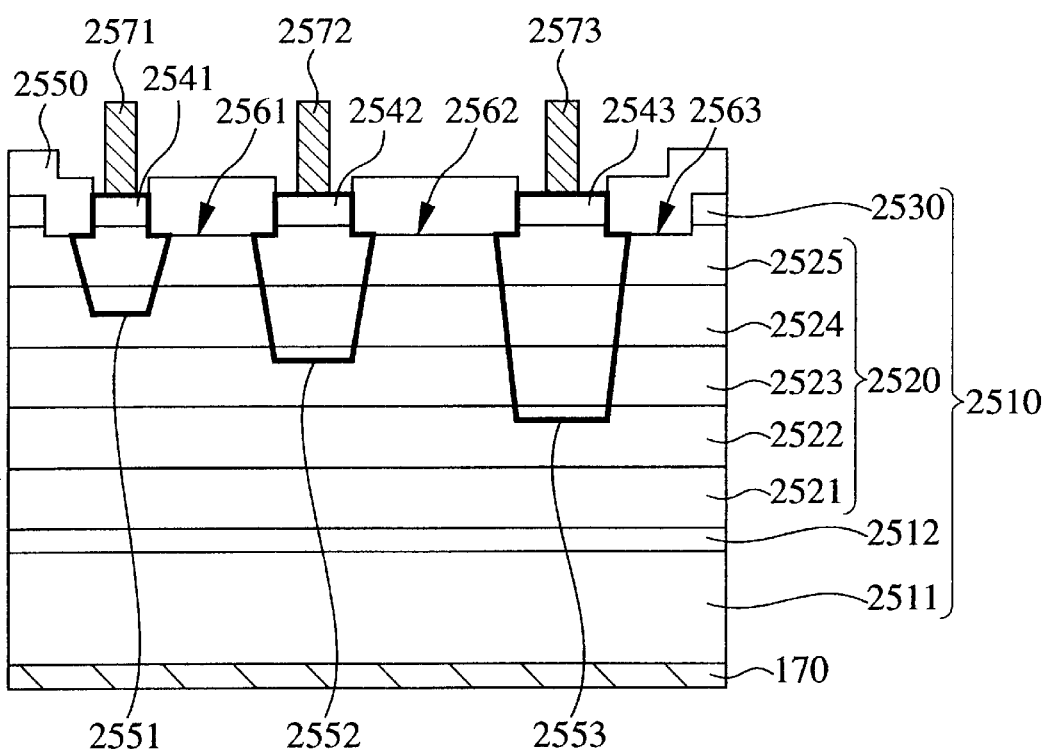

FIG. 25 is a plan view, and FIG. 26 is an A–A' cross-sectional view of FIG. 25. In FIG. 25 and FIG. 26, composing elements with the same numerals as in FIG. 1 to FIG. 3 are identical with the elements in the FIG. 1 to FIG. 3.

FIG. 25 and FIG. 26 show a case when three LEDs are arranged in one row, but the number and the arrangement of the LEDs are arbitrary.

As FIG. 25 and FIG. 26 show, an AlGaAs layer 2520 in a semiconductor substrate 2510 is formed by growing an n-type $Al_sGa_{1-s}As$ layer ($1≧s>0$) 2521, an n-type $Al_xGa_{1-x}As$ layer ($1≧x>0$) 2522, an n-type $Al_yGa_{1-y}As$ layer ($1≧y>0$) 2523, an n-type $Al_zGa_{1-z}As$ layer ($1≧z>0$) 2524, and an n-type $Al_tGa_{1-t}As$ layer ($1≧t>0$) 2525 sequentially on the surface of an n-type GaAs buffer layer 112 by epitaxy. The layer 2521 corresponds to the lower side clad layer of the present invention, and the layer 2525 corresponds to the upper side clad layer of the present invention.

Of the aluminum composition ratio, x, y and z of the layers 2522 to 2524, x is the smallest and z is the largest. The aluminum composition s of the layer 2521 is at least larger than x, and the aluminum composition ratio t is at least larger than z. In other words, the aluminum composition ratio s, x, y, z and t are determined so as to satisfy the inequality (3).

$$X<y<z \; s>x \, , \, t>z \tag{3}$$

Therefore the energy band gap Eqs, Egx, Egy, Egz and Egt of the layers 2521, 2522, 2523, 2524 and 2525 satisfy the inequality (4).

$$Egx<Egy<Egz \; Egs>Egx \, , \, Egt>Egz \tag{4}$$

For example, s=t=0.6, x=0.1, y=0.25 and z=0.4 are possible.

On the semiconductor layer 2520, a semi-insulating or an n-type GaAs layer 2530 is formed. In other words, in this embodiment, the top layer 2530 of the semiconductor substrate 2510 is formed with semi-insulating or an n-type GaAs.

P-type diffusion areas 2541, 2542 and 2543 are formed by diffusing zinc, for example, into the semiconductor substrate 2510. The diffusion area 2541 is formed such that the deepest part reaches the AlGaAs layer 2524. The diffusion area 2542 is formed such that the deepest part reaches the AlGaAs layer 2523. The diffusion area 2543 is formed such that the deepest part reaches the AlGaAs layer 2522. In other words, the area in the longitudinal direction of a diffusion front 2551 locates in the AlGaAs layer 2524, the area in the longitudinal direction of a diffusion front 2552 locates in the AlGaAs layer 2523, and the area in the depth direction of a diffusion front 2553 locates in the AlGaAs layer 2522.

In the LED 2500 of this embodiment,. the lateral diffusion front regions at least in the GaAs layer 2530 are removed by etching, just like the cases of the above embodiments. Grooves 2561, 2562 and 2563 are formed by this etching.

On the p-type areas of the GaAs layer 2530, p-type side electrodes 2571, 2572 and 2573 are formed.

In this embodiment, the composing elements 2511, 2512 and 2550 are respectively identical to the composing elements 111, 112 and 150 in the first embodiment.

As mentioned above, the p-type areas 2541, 2542 and 2543 are formed by a diffusion method, so the deeper these areas are formed the wider the width becomes. Therefore to increase the degree of integration of the LED elements (density of the LED element) to fabricate an LED array, for example, it is preferable to form the p-type; areas 2541, 2542 and 2543 to be shallow. For example, the thickness of the n-type GaAs buffer layer 2512 can be 0.1 $\mu$m, the thickness of the AlGaAs layers 2521 to 2525 can be 0.5 $\mu$m respectively, and the thickness of the GaAs layer 2530 can be 0.05 $\mu$m. In this case, the total thickness of these layers is 2.65 $\mu$m, which means that a practically sufficient degree of integration (LED element density) can be obtained.

Next the operation of the LED 2500 is described with reference to FIG. 27.

Figure 27:
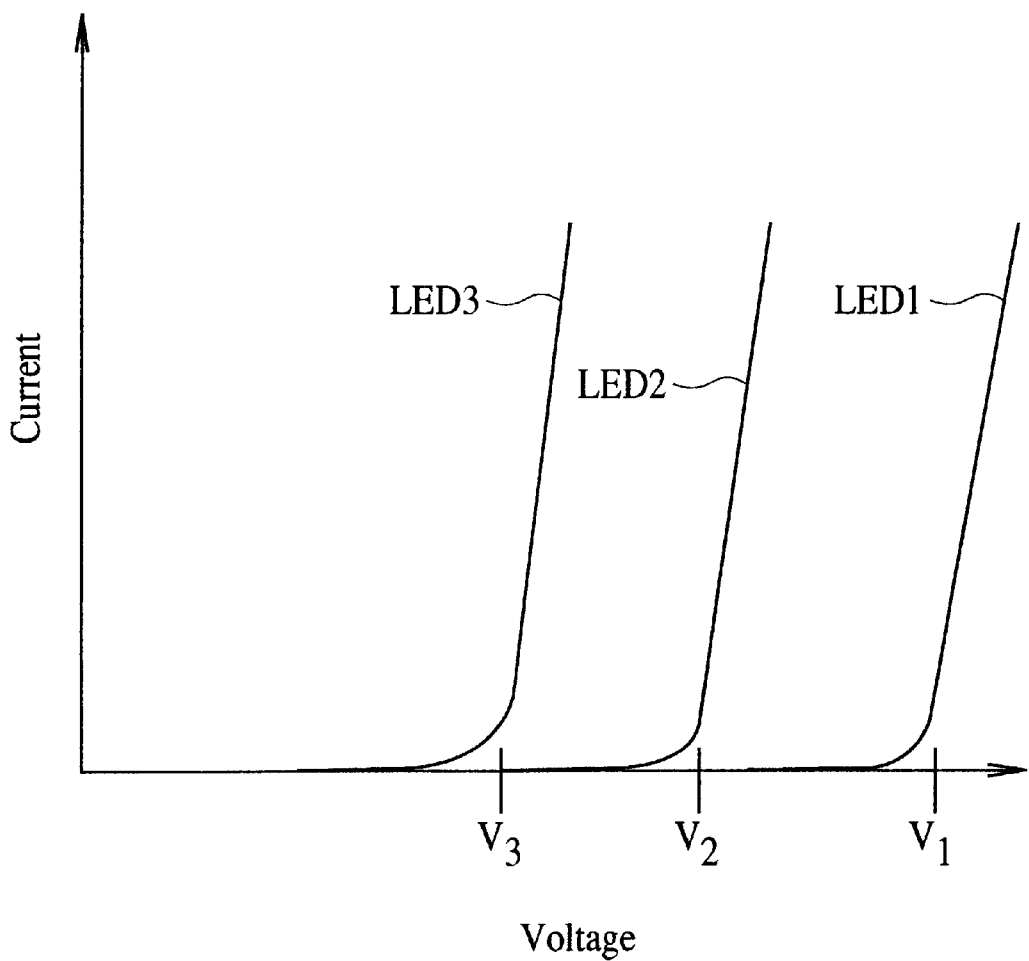

In FIG. 27, the LED element corresponding to the diffusion front 2551 is indicated as the LED 1, the LED element corresponding to the diffusion front 2552 as LED 2, and the LED element corresponding to the diffusion front 2553 as LED 3.

As described for the fifth embodiment, minority carriers are mainly injected through a pn-junction (a diffusion front) in a layer where the energy band gap is smaller as the inequality (4) shows. Therefore in this embodiment, minority carriers are injected through the pn junction in the layer 2524 (namely, the diffusion front 2551), minority carriers are injected through the pn junction in the layer 252 3 (namely, the diffusion front 255 2), and minority carriers are injected through the pn junction in the layer 2522 (namely, the diffusion front 2553). Since the wave length of light depends on the energy band gap, the light wave lengths to be emitted in the vicinity of the pn junctions in the layers 2522, 2523 and 2524 are different from each other.

In FIG. 27, the LED 1 emits light with wave length $\lambda 1$; threshold voltage is V1. The LED 2 emits light with wave length $\lambda 2$; threshold voltage is V2. The LED 3 emits light with wavelength $\lambda 3$; threshold voltage is V3. The relationship among V1, V2 and V3 and the relationship among f $\lambda 1$, $\lambda 2$ and $\lambda 3$ are given by the inequality (5).

$$V1>V2>V3 \; \lambda1<\lambda2<\lambda3 \tag{5}$$

When the aluminum composition ratios of the layers 2522, 2523 and 2524 are x=0.1, y=0.25 and z=0.4, for example, V1 is approximately 1.9 volt, V2 is approximately 1.7 volt, V3 is approximately 1.6 volt, $\lambda 1$ is approximately 650 nm, $\lambda 2$ is approximately 730 nm and $\lambda 3$ is approximately 780 nm.

As described in the inequality (4), Egx<Egy<Egz<Egt. Therefore the emitted light from each LED transmits through the upper layers which have a higher energy band gap than the layer where the LED light was generated.

The LED 2500 of this embodiment has the groves 2561, 2562 and 2563, just like the above mentioned embodiments, therefore minority carriers are not injected through the lateral diffusion front in the GaAs layer 2530. As the result, the light emission efficiencies (the emitted light power) of the LED 2500 increases.

Additionally, injected minority carriers recombine in the layers 2522,2523 and 2524 for the LED3, LED2 and LED1 (carriers recombine in the deep area of the AlGaAs layer 2520). This also leads to increase of the light emission efficiencies (the emitted light power).

In this embodiment, the GaAs layer 2530 is disposed as the top layer of the semiconductor substrate 2510. However, a layer formed with another material may be used as the top layer only if the layer can make ohmic connections with the electrodes 2571, 2572 and 2573. For example, an AlGaAs layer where the aluminum composition ratio is 0.2 or less can be used as the top layer. Also an n-type GaAs layer can be used as the top layer. The compound semiconductors other than AlGaAs, such as InGaAsP, InGaP, etc. can be also used in this embodiments.

Figure 28:
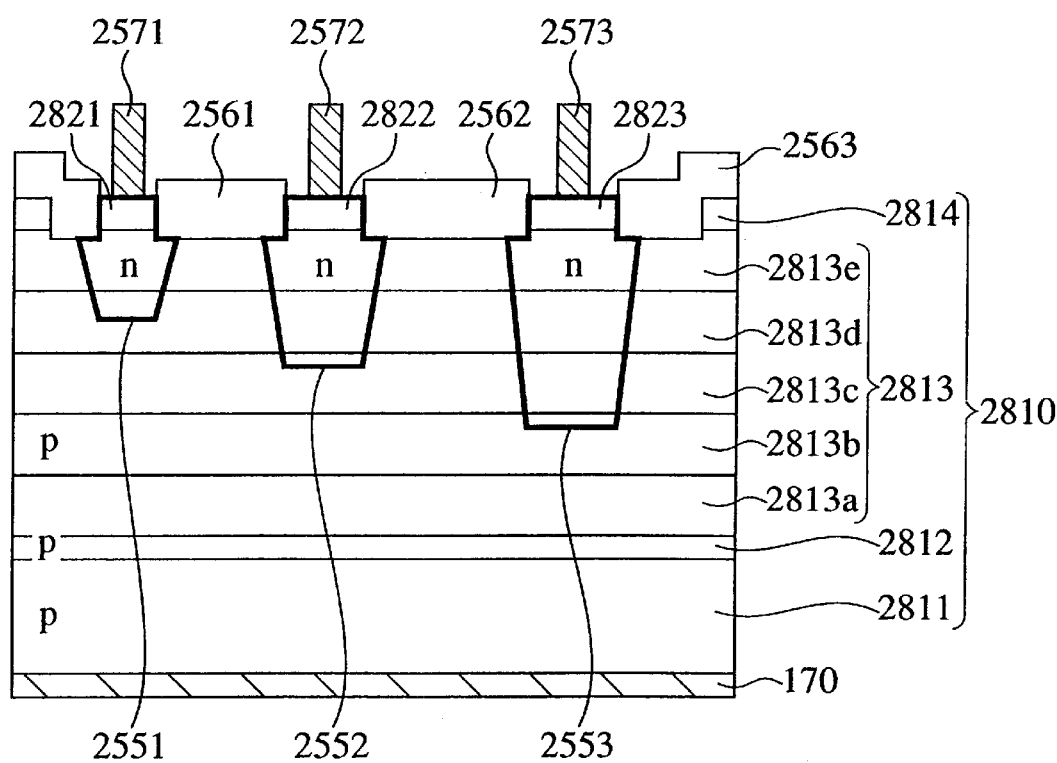

FIG. 28 is an example when an LED is fabricated by selectively diffusing an n-type impurity-to a p-type layer of a semiconductor substrate.

In the LED 2800 shown in FIG. 28, the p-type semiconductor substrate 2810 comprises a p-type GaAs substrate 2811, a p-type GaAs buffer layer 2812, a p-type AlGaAs layer 2813 and a semi-insulating GaAs layer 2814. The AlGaAs layer 2813 further comprises a p-type $Al_sGa_{1-s}As$ layer ($1≧s>0$) 2813a, a p-type $Al_xGa_{1-x}As$ layer ($1≧x>0$) 2813b, a p-type $Al_yGa_{1-y}As$ layer ($1≧y>0$) 2813c, a p-type $Al_zGa_{1-z}As$ layer ($1≧z>0$) 2813d, and a p-type $Al_tGa_{1-t}As$ layer ($1≧t>0$) 2813e.

In the semiconductor substrate 2810, n-type diffusion areas 2821, 2822 and 2823 with different depths are formed, just like the case of the LED 2500.

Descriptions of the other composing elements shown in FIG. 28 are omitted because they are equivalent to those of the corresponding elements of the LED 2500.

In this way, this embodiment can also be applied to an LED which is fabricated by selectively diffusing an n-type impurity to the p-type layer of the semiconductor substrate.

Tenth Embodiment

Next the tenth embodiment is described with reference to FIG. 29 to FIG. 31.

Figure 29:
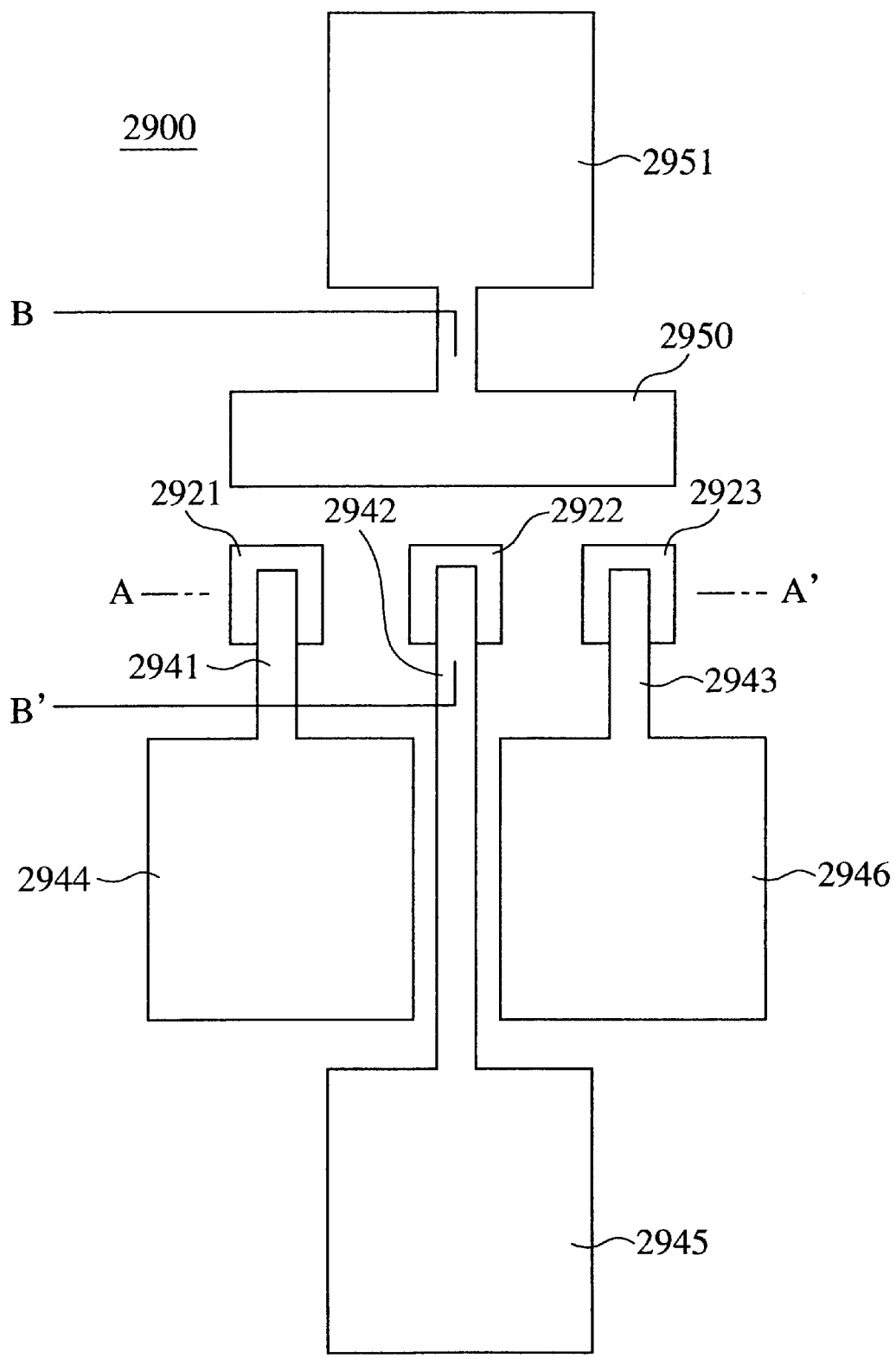
FIG. 29 to FIG. 32 are drawings depicting a configuration of a semiconductor optical device in accordance with the tenth embodiment of the present invention.
Figure 30:
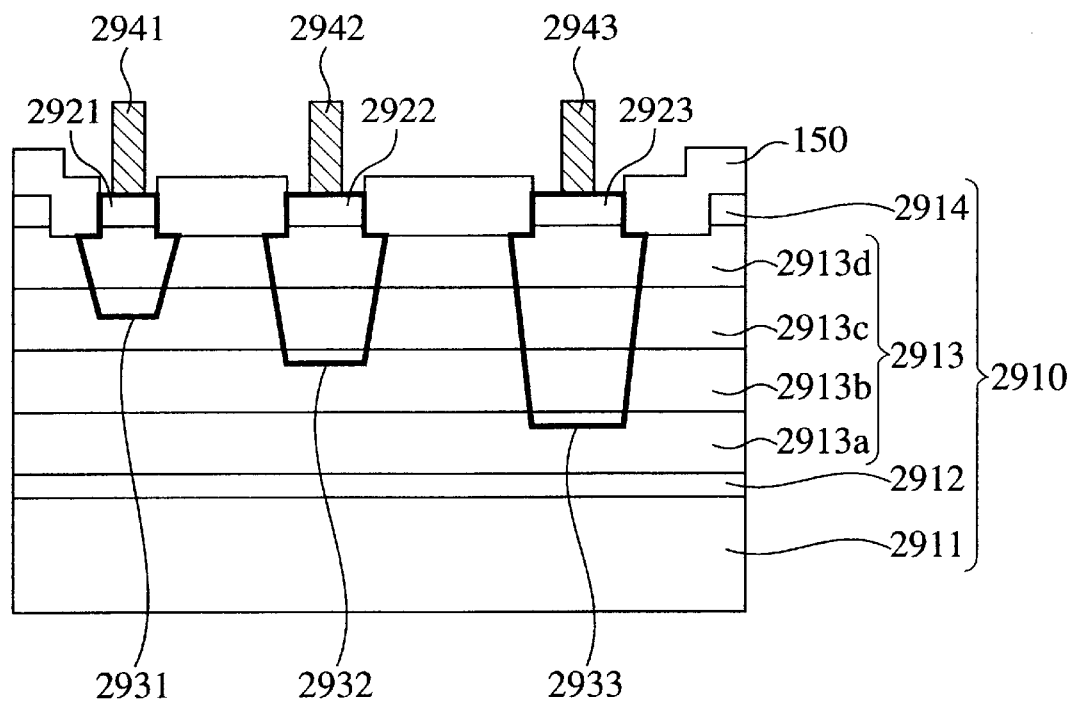
Figure 31:
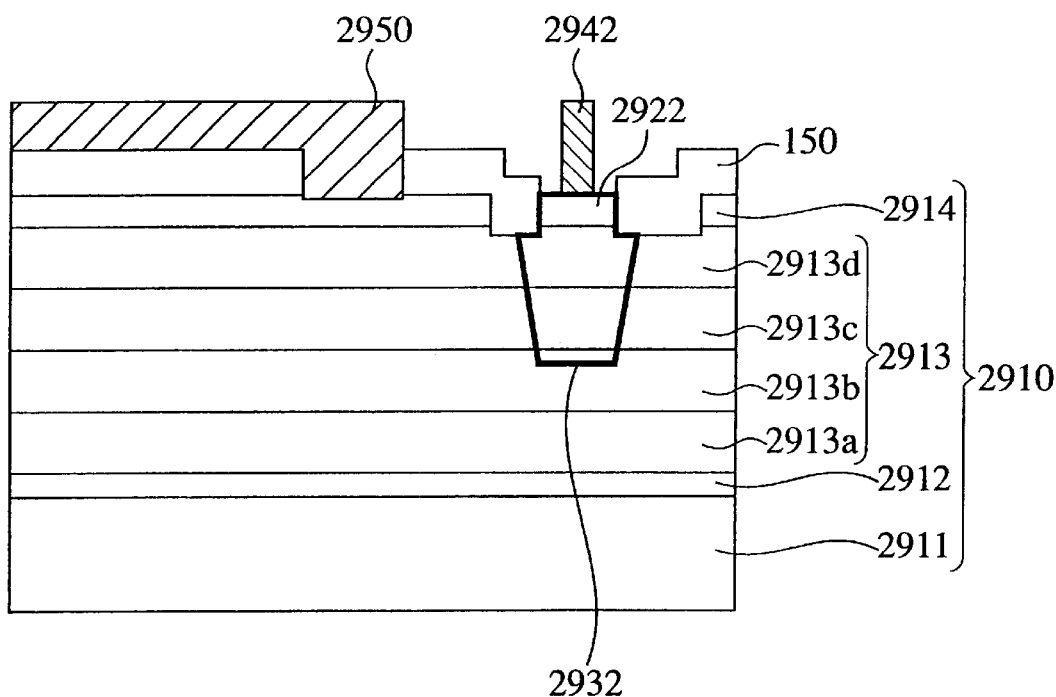

FIG. 29 is a plan view of an LED 2900 in accordance with this embodiment, FIG. 30 is an A–A' cross-sectional view of FIG. 29, and FIG. 31 is a B–B' cross-sectional view of FIG. 29. In FIG. 29 to FIG. 31, composing elements with the same numerals as in FIG. 25 and FIG. 26 are identical with the elements in FIG. 25 and 26.

FIG. 29 to FIG. 31 show a case when three LEDs are arranged in one row, but the number and the arrangement of the LEDs are arbitrary.

In the LED 2900, an n-type semiconductor substrate 2910 comprises a semi-insulating GaAs substrate 2911, a semi-insulating GaAs buffer layer 2912, an n-type AlGaAs layer 2913, and an n-type GaAs layer 2914. The AlGaAs layer 2913 further comprises an n-type $Al_xGa_{1-x}As$ layer ($1 \geq x > 0$) 2913a, an n-type $Al_yGa_{1-y}As$ layer ($1 \geq y > 0$). 2913b, an n-type $Al_zGa_{1-z}As$ layer ($1 \geq z > 0$) 2913c and an n-type $Al_zGa_{1-z}As$ layer ($1 \geq t > 0$) 2913d.

In the semiconductor substrate 2910, p-type diffusion areas 2921, 2922 and 2923 with different depths are formed. Diffusion fronts 2931, 2932 and 2933 are formed in the layers of 2913c, 2913b, 2913a, respectively.

In the LED 2900, the p-type side ohmic electrodes 2941, 2942 and 2943 are formed on the p-type GaAs areas 2921, 2922 and 2923. These electrodes 2941, 2942 and 2943 are connected to the electrode pads 2944, 2945 and 2946, respectively.

Also in the LED 2900, an n-type side ohmic electrode 2950 is formed on the n-type GaAs layer 2914. This electrode 2950 is connected to the electrode pad 2951.

Descriptions of the other composing elements are omitted because they are equivalent to those of the corresponding elements of the LED 2500 shown in FIG. 25 and FIG. 26.

The difference of the LED 2900 of this embodiment from the LED 2500 of the ninth embodiment is that the n-type AlGaAs layer 2913 is comprised of four layers, that is, the n-type AlGaAs layer 2913 does not have a lower cladding layer corresponding to the $Al_sGa_{1-s}As$ clad layer 2521 of the LED 2500.

Disposing the grooves 2561, 2562 and 2563 prevents an injected minority carrier recombination in the GaAs layer 2914, and increases the light emission efficiency (the emitted light power) of the LED 2900.

Also, forming the n-type AlGaAs layer 2913 with four layers decreases the number of manufacturing processes, which makes it possible to decrease the manufacturing cost of the substrate 2910. It is also possible to fabricate an LED which does not have the n-type $Al_tGa_{1-t}As$ layer 2913d; a manufacturing cost of the substrate is even lower than the substrate 2910.

In this embodiment, the n-type GaAs layer 2914 is used as the top layer of the semiconductor substrate 2910. A layer formed with another material may be used as the top layer only if the layer can make ohmic connections with the electrodes 2941, 2942, 2943, and 2950. For example, an AlGaAs layer where the aluminum composition ratio is 0.2 or less can be used as the top layer.

In FIG. 29, the electrode pads 2944, 2945 and 2946 and the electrode pad 2951 are disposed at the opposite sides of the LED element, but they may be disposed at a same side.

Figure 32:
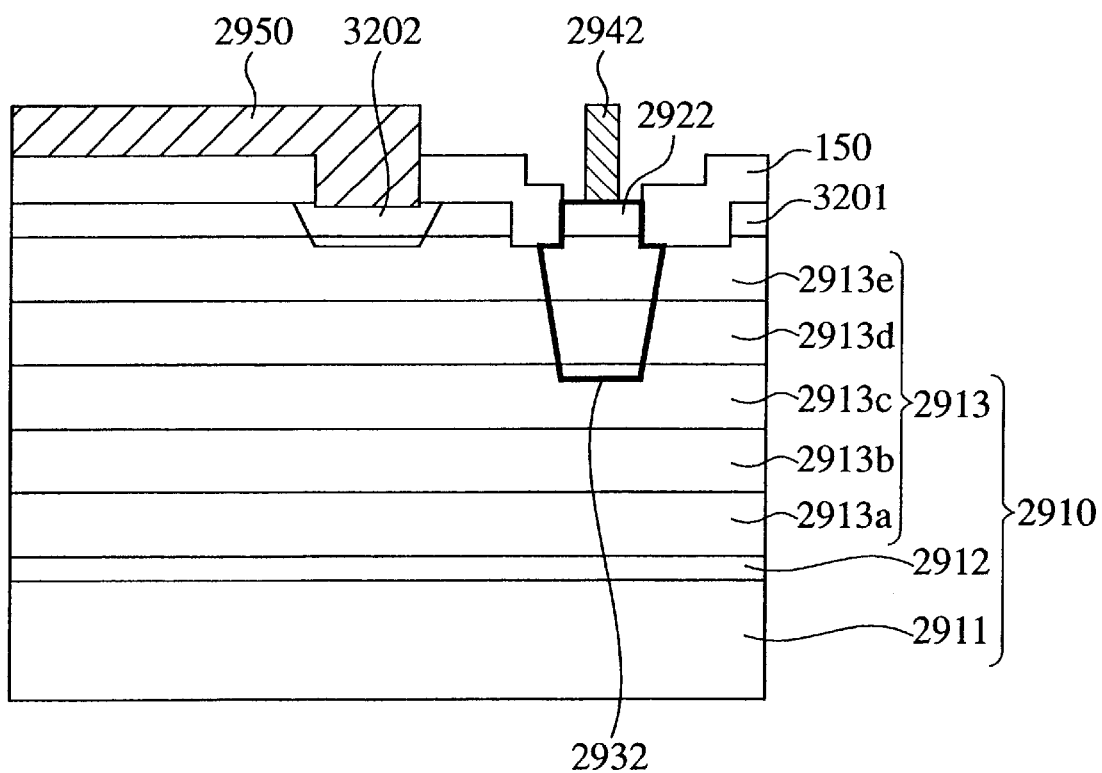

FIG. 32 shows an example when a semi-insulating GaAs layer 3201 is used as the top layer of the semiconductor substrate 2910.

In the LED 3200 shown in FIG. 32, an n-type area 3202 is formed by implanting an n-type impurity to a part of the semi-insulating GaAs layer 3201. The n-type side ohmic electrode 2950 is formed so as to contact the n-type area 3202. As then-type impurity, tin and silicon can be used, for example.

In the first to tenth embodiments, the n-type semiconductor layer is formed with AlGaAs, but may be formed with the other compound semiconductor materials, such as AlGaAsP, InGaAsP, InGaP, InGaAlP, etc.

As described above, in accordance with the present invention, the diffusion front formation area near the surface of the semiconductor substrate is removed, therefore the emission efficiency of the semiconductor optical device can be improved.

What is claimed is:

1. A semiconductor optical device comprising;
   a semiconductor substrate having a first conductive type semiconductor layer;
   a second conductive type area formed in said semiconductor layer by doping a second conductive type impurity, which is a different conductive type from the first conductive type, selectively from the surface of said semiconductor substrate; and
   an etched area formed to remove the interface between said second conductive type area and the first conductive type semiconductor layer near the surface of said semiconductor substrate.

2. The semiconductor optical device according to claim 1, wherein said etched area is formed in a grooved shape.

3. The semiconductor optical device according to claim 1, wherein said etched area is formed so as to remove an entire area near the surface of said semiconductor substrate except for an ohmic contact area at least.

4. The semiconductor optical device according to claim 1, wherein said etched area is formed so as to remove an area near the surface at least for a light emitting area of said first conductive type semiconductor layer.

5. The semiconductor optical device according to claim 1, further comprising a first ohmic electrode which is formed so as to contact the surface of said second conductive type area, and a second ohmic electrode which is formed so as to contact the rear face of said semiconductor substrate.

6. The semiconductor optical device according to claim 1, further comprising a first ohmic electrode which is formed so as to contact the surface, of said second conductive type area, and a second ohmic electrode which is formed so as to contact the first conductive type area of the surface of said semiconductor substrate.

7. The semiconductor optical device according to claim 1, wherein a diffusion method is used as a technology to selectively supply said second conductive impurity.

8. The semiconductor optical device according to claim 7, wherein said first conductive type is n-type, said second conductive type is p-type and said second type conductive impurity is zinc.

* * * * *